United States Patent
Chou

(10) Patent No.: US 11,121,088 B2
(45) Date of Patent: Sep. 14, 2021

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventor: Ting-Yang Chou, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/655,138

(22) Filed: Oct. 16, 2019

(65) Prior Publication Data
US 2021/0118802 A1   Apr. 22, 2021

(51) Int. Cl.
| | |
|---|---|
| H01L 23/31 | (2006.01) |
| H01L 23/538 | (2006.01) |
| H01L 23/522 | (2006.01) |
| H01L 21/02 | (2006.01) |
| H01L 21/56 | (2006.01) |

(52) U.S. Cl.
CPC .... *H01L 23/5384* (2013.01); *H01L 21/02013* (2013.01); *H01L 21/563* (2013.01); *H01L 23/3171* (2013.01); *H01L 23/5226* (2013.01)

(58) Field of Classification Search
CPC ......... H01L 23/12; H01L 23/15; H01L 23/31; H01L 23/522; H01L 23/538; H01L 23/5384; H01L 23/3171; H01L 23/5226; H01L 21/02; H01L 21/563; H01L 21/02013; H01L 2224/0231; H01L 2224/0237; H01L 23/00; H01L 21/00
USPC ........................................................ 257/774
See application file for complete search history.

(56) References Cited

U.S. PATENT DOCUMENTS

2008/0316714 A1* 12/2008 Eichelberger ....... H01L 23/5389
                                                  361/728
2015/0069623 A1   3/2015 Tsai et al.

* cited by examiner

*Primary Examiner* — Chuong A Luu
(74) *Attorney, Agent, or Firm* — Foley & Lardner LLP

(57) ABSTRACT

A method of manufacturing a semiconductor package structure is provided. The method includes providing a first carrier, forming a patterned buffer layer over the first carrier, forming a first redistribution structure that includes forming a first dielectric layer on the patterned buffer layer, after an electrical testing by applying an electric signal towards the first redistribution structure, removing the first carrier, removing portions of the first dielectric layer, resulting in a patterned first dielectric layer, the patterned first dielectric layer exposing portions of the first circuit layer, removing the exposed portions of the first circuit layer, using the patterned first dielectric layer as a mask, resulting in a patterned first circuit layer, and forming an electric conductor in a recess defined by the patterned first dielectric layer and the patterned first circuit layer.

19 Claims, 55 Drawing Sheets

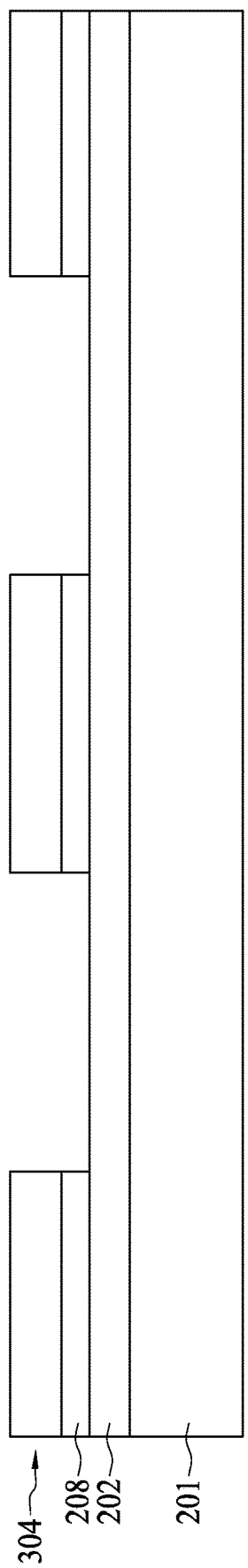

SEMICONDUCTOR PACKAGE STRUCTURE AND METHOD OF MANUFACTURING THE SAME

BACKGROUND

1. Field of the Disclosure

The present disclosure is generally related to semiconductor packaging and, in particular, to a semiconductor package structure and a method of manufacturing the same.

2. Description of the Related Art

Along with the rapid development in electronics industry and the progress of semiconductor processing technologies, semiconductor chips are integrated with an increasing number of electronic components to achieve improved electrical performance and additional functions. As a result, more input/output (I/O) pads are specified for electrical connection among these chips and components. To ensure the desired performance and functions, electrical tests are performed during manufacturing a semiconductor device package to determine if electrical connection in the semiconductor device package manufactured thus far is operational.

SUMMARY

Embodiments of the present disclosure provide a semiconductor package structure. The semiconductor package structure includes a first semiconductor device, a second semiconductor device, a redistribution structure for electrical connection between the first semiconductor device and the second semiconductor device, the redistribution structure including a patterned first dielectric layer having a first surface and a second surface opposite to the first surface, a second dielectric layer, between the first semiconductor device and the patterned first dielectric layer, disposed on the first surface of the patterned first dielectric layer, and a patterned first circuit layer disposed on the first surface of the patterned first dielectric layer and extending in the second dielectric layer, and an electric conductor, disposed in a recess defined by the patterned first dielectric layer and the patterned first circuit layer, for electric connection via the redistribution structure.

Some embodiments of the present disclosure provide a method of manufacturing a semiconductor package structure. The method includes, before a testing stage, providing a first carrier, forming a patterned buffer layer over the first carrier, forming a first redistribution structure that includes forming a first dielectric layer on the patterned buffer layer, forming a stack of circuit layers including a first circuit layer on the first dielectric layer and a second circuit layer on the first circuit layer, and forming a second dielectric layer on the first dielectric layer and the second circuit layer, and after the testing stage, removing the first carrier by laser debonding, using the patterned buffer layer as a mask, removing portions of the first dielectric layer unmasked by the patterned buffer layer, resulting in a patterned first dielectric layer, the patterned first dielectric layer exposing portions of the first circuit layer, removing the exposed portions of the first circuit layer, using the patterned first dielectric layer as a mask, resulting in a patterned first circuit layer, and forming an electric conductor in a recess defined by the patterned first dielectric layer and the patterned first circuit layer.

Embodiments of the present disclosure also provide a method of manufacturing a semiconductor package structure. The method includes providing a first carrier, forming a patterned buffer layer over the first carrier, forming a first redistribution structure that includes forming a first dielectric layer on the patterned buffer layer, after an electrical testing by applying an electric signal towards the first redistribution structure, removing the first carrier, removing portions of the first dielectric layer, resulting in a patterned first dielectric layer, the patterned first dielectric layer exposing portions of the first circuit layer, removing the exposed portions of the first circuit layer, using the patterned first dielectric layer as a mask, resulting in a patterned first circuit layer, and forming an electric conductor in a recess defined by the patterned first dielectric layer and the patterned first circuit layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 3A, FIG. 3B, FIG. 3C, FIG. 3D, FIG. 3E, FIG. 3F, FIG. 3G, FIG. 3H, FIG. 3I, FIG. 3J, and FIG. 3K are cross-sectional views each illustrating one or more stages of a method of manufacturing the semiconductor package structure as described and illustrated with reference to FIG. 1B, in accordance with an embodiment of the present disclosure.

DETAILED DESCRIPTION

Figure 1A:
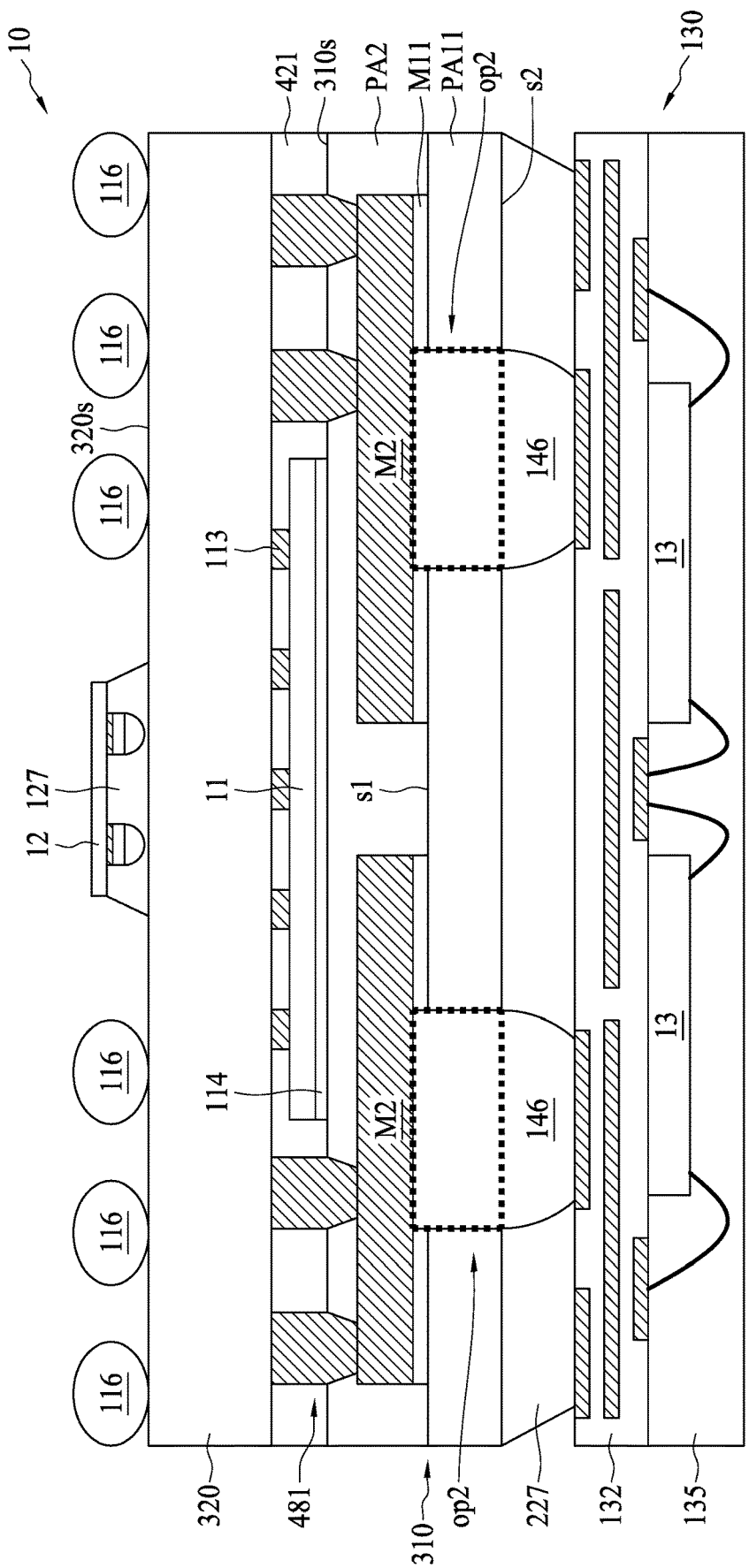
FIG. 1A is a cross-sectional view of a semiconductor package structure in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of a semiconductor package structure 10 in accordance with an embodiment of the present disclosure.

Referring to FIG. 1A, the semiconductor package structure 10 includes a first semiconductor device 11, a second semiconductor device 12, a packaged device 130 including one or more third semiconductor devices 13, a first redistribution structure 310 between the first and third semiconductor devices 11, 13, and a second redistribution structure 320 between the first and second semiconductor devices 11, 12. In an embodiment, the first semiconductor device 11 includes an application processor, the second semiconductor device 12 includes an integrated passive device, and the third semiconductor devices 13 include memory devices.

The first redistribution structure 310 provides electrical connection between the first semiconductor device 11 and the third semiconductor devices 11, 13. The first semiconductor device 11 is electrically connected to the third semiconductor devices 13 via the first redistribution structure 310 and electrical conductors 146 partially formed in the first redistribution structure 310. The second redistribution structure 320 provides electrical connection between the first and second semiconductor devices 11, 12. Moreover, the first semiconductor device 11 is electrically connected to an external semiconductor device or component via the second redistribution structure 320 and electrical conductors 116 disposed on the second redistribution structure 320.

The first redistribution structure includes a patterned first dielectric layer PA11, a patterned second dielectric layer PA2, and a circuit layer M. The patterned first dielectric layer PA11 has a first surface s1 and a second surface s2 opposite to the first surface s1. The patterned second dielectric layer PA2 is disposed on the first surface s1 of the patterned first dielectric layer PA11 and between the first semiconductor device 11 and the patterned first dielectric layer PA11. The circuit layer M includes a patterned first conductive layer M11 and a second conductive layer M2. The circuit layer M extends in the patterned second dielectric layer PA2. The patterned first conductive layer M11 is disposed on the first surface s1 of the patterned first dielectric layer PA11, and extends in the patterned second dielectric layer PA2. The patterned first conductive layer M11 may serve as a seed layer for the second conductive layer M2. The second conductive layer M2 is stacked on the patterned first conductive layer M11, and extends in the patterned second dielectric layer PA2.

A recess op2 is defined by the patterned first dielectric layer PA11 and the patterned first conductive layer M11. The recess op2 provides a space for holding or accommodating an electrical conductor 146. The electrical conductor 146 penetrates the patterned first dielectric layer PA11 and electrically connects the second conductive layer M2 to the one or more third semiconductor devises 13. As a result, the recess op2 is further defined by the second conductive layer M2 in addition to the patterned first dielectric layer PA11 and the patterned first conductive layer M11. A portion of the electrical conductor 146 is accommodated in the recess op2, and the remaining portion of the electrical conductor 146 protrudes from the second surface s2 of the patterned first dielectric layer PA11. In an existing redistribution structure corresponding to the first redistribution structure 310 of the present disclosure, such electrical conductor may be disposed on or over a surface of a first dielectric layer. Unlike the existing structure, the recess op2 provides a space for an electrical conductor to be deeply rooted, which ensures a relatively reliable electrical connection.

The first semiconductor device 11, disposed on a surface 310s of the first redistribution structure 310, includes studs 113 for electrical connection. An adhesive film 114 may be used to facilitate attaching the first semiconductor device 11 to the first redistribution structure 310. A patterned conductive layer 481, disposed in an encapsulating layer 115 that encapsulates the first semiconductor device 11 and extending into the patterned second dielectric layer PA2, is electrically connected between the second conductive layer M2 and the second redistribution structure 320.

The second semiconductor device 12 is face-down connected to a surface 320s of the second redistribution structure 320. An underfill 127 is applied between the second semiconductor device 12 and the second redistribution structure 320. The underfill 127 provides protection of the second semiconductor device 12 from moisture, ionic contaminants, radiation, and hostile operating environments with thermal, mechanical, shock, and vibration stresses. Electrical conductors 116, disposed on the surface 320s of the second redistribution structure 320, provide electrical connection of the first semiconductor device 11 to an external semiconductor device.

The third semiconductor devices 13 are encapsulated in an encapsulating layer 135. The third semiconductor devices 13 are electrically connected to the first semiconductor device 11 via a redistribution structure 132 and electrical conductors 146. The electrical conductors 146, partially disposed in the patterned first dielectric layer PA11 of the first redistribution structure 310, are electrically connected between the second conductive layer M2 and the redistribution structure 132. Moreover, portions of the electrical conductors 146 that protrude from the second surface s2 of the patterned first dielectric layer PA11 are sealed in an underfill 227 disposed between the redistribution structure 132 and the first redistribution structure 310. The underfill 227 provides protection of the electrical conductors 146 from moisture, ionic contaminants, radiation, and hostile operating environments with thermal, mechanical, shock, and vibration stresses.

In an embodiment, the patterned first dielectric layer PA11 includes organic materials, for example, a molding compound, polyamide (PA), polyimide (PI), polybenzoxazole (PBO) or an epoxy-based material. In another embodiment, the patterned first dielectric layer PA11 includes inorganic materials, for example, silicon oxide (SiOx), silicon nitride (SiNx) or tantalum oxide (TaOx). In addition, the patterned second dielectric layer PA2 may include organic materials, for example, a molding compound, PA, PI, PBO or an epoxy-based material. Moreover, the patterned second dielectric layer PA2 may include inorganic materials, for example, SiOx, SiNx or TaOx. The material of the patterned first dielectric layer PA11 may be the same as or different from the material of the patterned second dielectric layer PA2.

In an embodiment, the patterned first conductive layer M11 includes titanium (Ti), a titanium-tungsten alloy (TiW), nickel (Ni), copper (Cu), a titanium-copper alloy (TiCu), silver (Ag), gold (Au) or other suitable conductive materials. The second conductive layer M2 may include Cu, silver (Ag), gold (Au) or other suitable conductive materials.

Figure 1B:
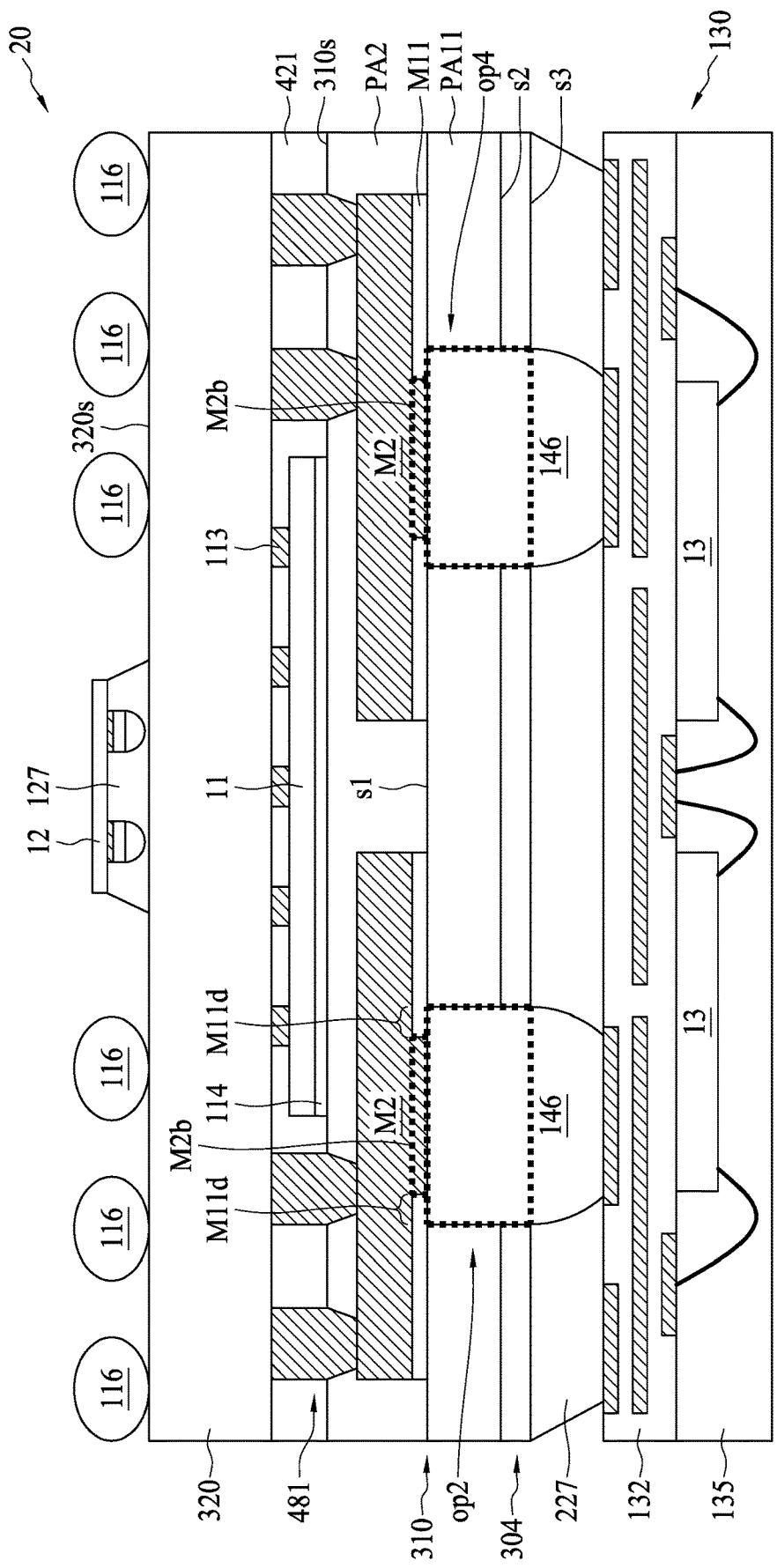
FIG. 1B is a cross-sectional view of a semiconductor package structure in accordance with another embodiment of the present disclosure.

FIG. 1B is a cross-sectional view of a semiconductor package structure 20 in accordance with another embodiment of the present disclosure.

Referring to FIG. 1B, the semiconductor package structure 20 is similar to the semiconductor package structure 10 described and illustrated with reference to FIG. 1A except that, for example, a recess op4 is defined by a bulge portion M2b of the second conductive layer M2 and a patterned passivation layer 304. The recess op4 provides a space for holding or accommodating an electrical conductor 146. Specifically, the recess op4 is defined by the bulge portion M2b, the patterned passivation layer 304, the patterned first dielectric layer PA11 and the patterned first conductive layer M11. The bulge portion M2b extends from the main of the second conductive layer M2 into the patterned first conductive layer M11, and is contiguous with the patterned first conductive layer M11. The bulge portion M2b of the second conductive layer M2 and portions M11d of the patterned first conductive layer M11 unmasked by the first patterned dielectric layer PA11 form a bottom surface of the recess op4 for seating an electrical conductor 146. The electrical conductor 146 electrically connects the second conductive layer M2 at the bulge portion M2b to the one or more third semiconductor devises 13. A portion of the electrical conductor 146 is accommodated in the recess op4, and the remaining portion of the electrical conductor 146 protrudes from a surface s3 of the patterned passivation layer 304 towards the redistribution structure 132. As a result, like the recess op2 described and illustrated with reference to FIG. 1A, the recess op4 provides a space for an electrical conductor to be deeply rooted, which ensures a relatively reliable electrical connection. In addition, the patterned passivation layer 304, disposed between the patterned first dielectric layer PA11 and the third semiconductor devices 13, functions to alleviate stress on the patterned first dielectric layer PA11 due to the electrical conductors 146.

Figure 2A:
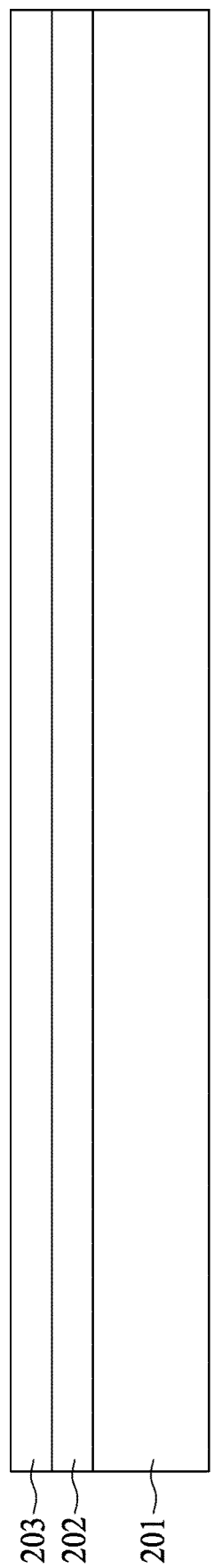
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, FIG. 2O, FIG. 2P, FIG. 2Q, FIG. 2R, FIG. 2S, FIG. 2T, and FIG. 2U are cross-sectional views each illustrating one or more stages of a method of manufacturing the semiconductor package structure as described and illustrated with reference to FIG. 1A, in accordance with an embodiment of the present disclosure.
Figure 2B:
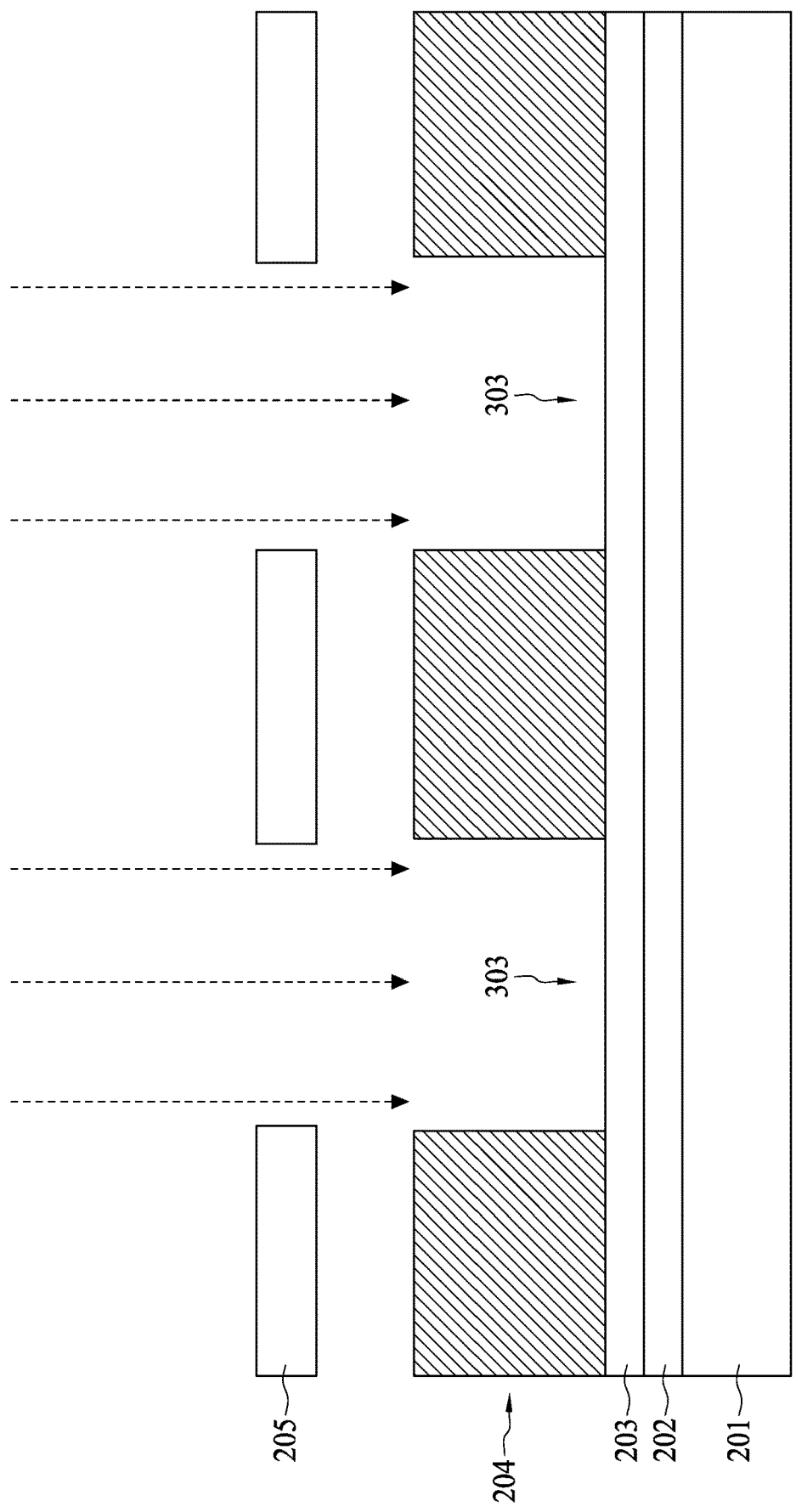
Figure 2C:
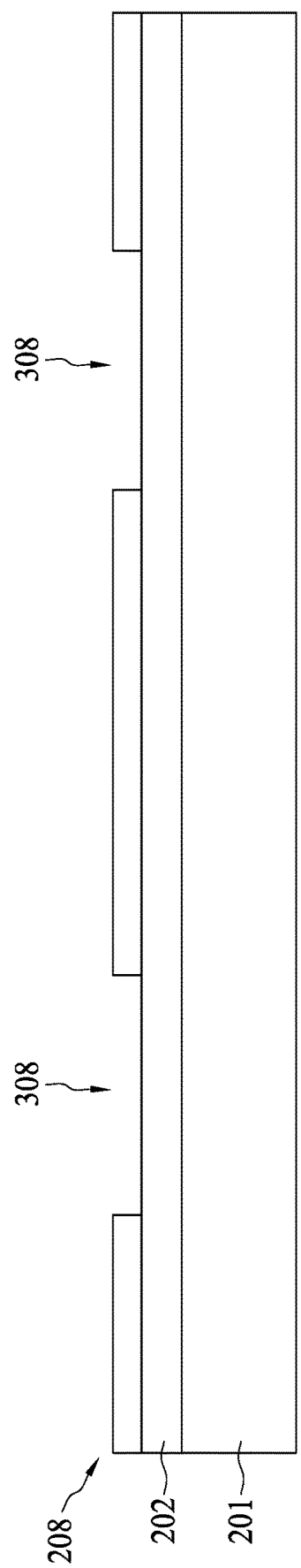
Figure 2D:
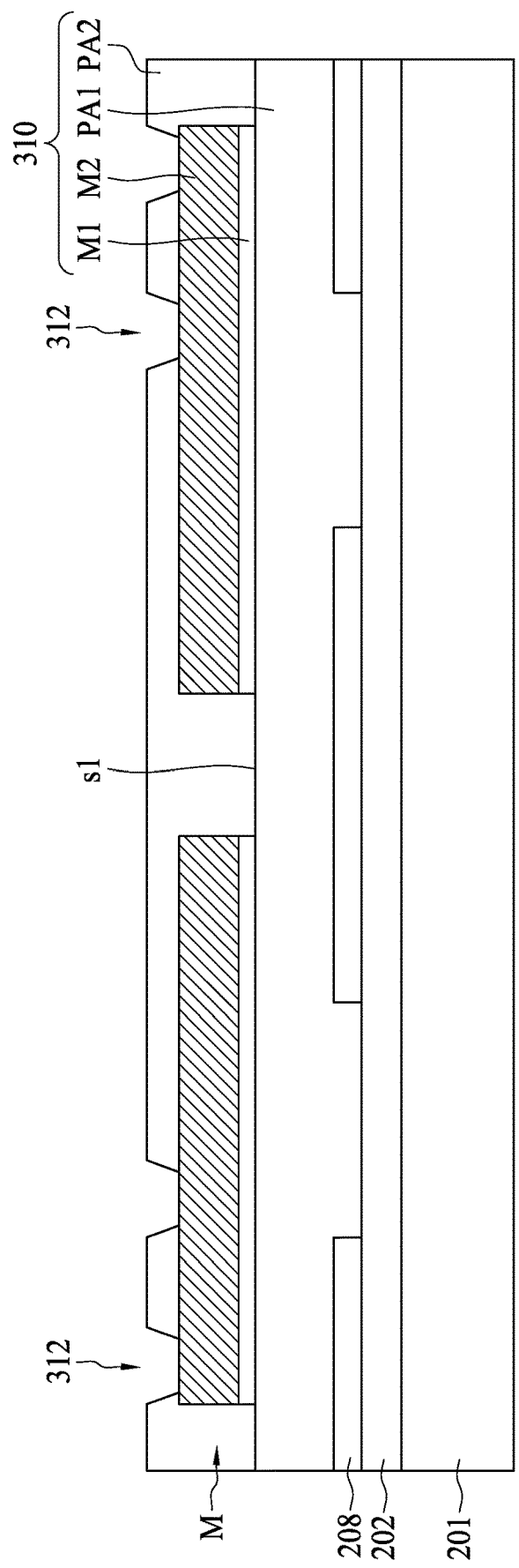
Figure 2E:
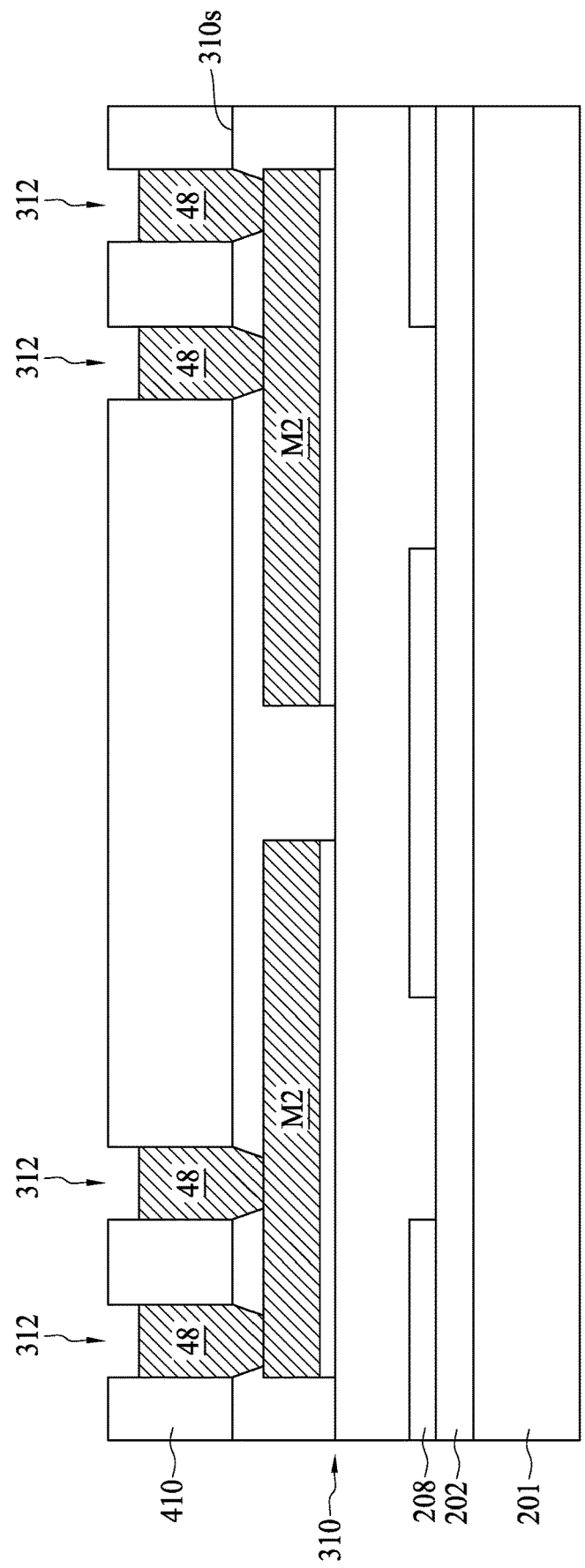
Figure 2F:
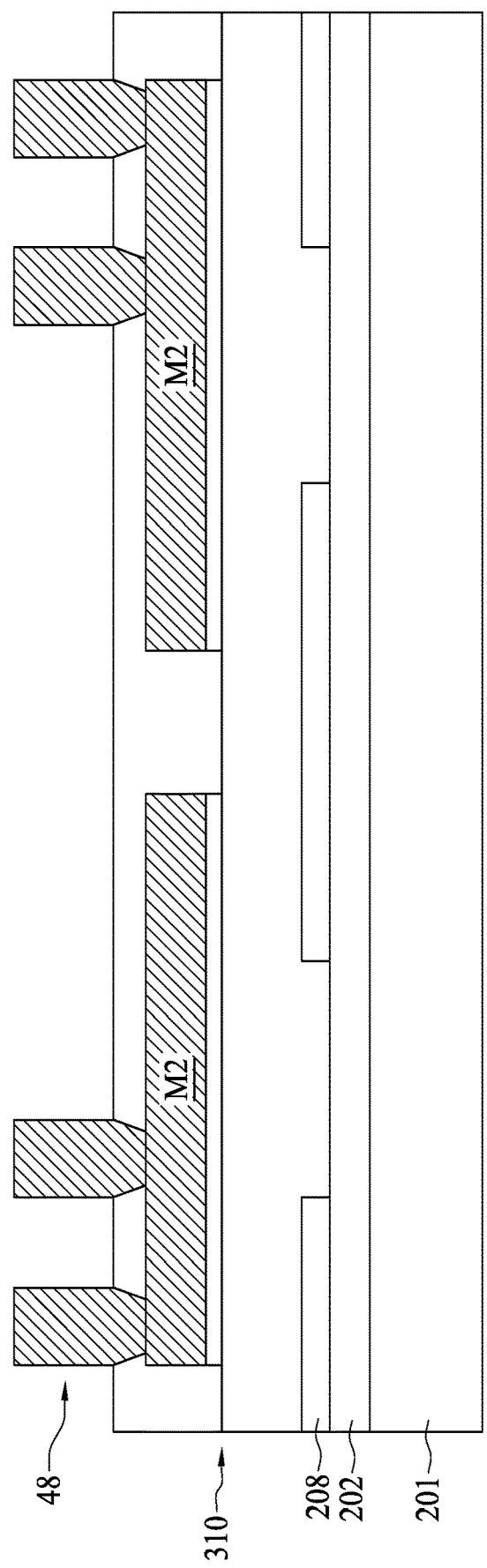
Figure 2G:
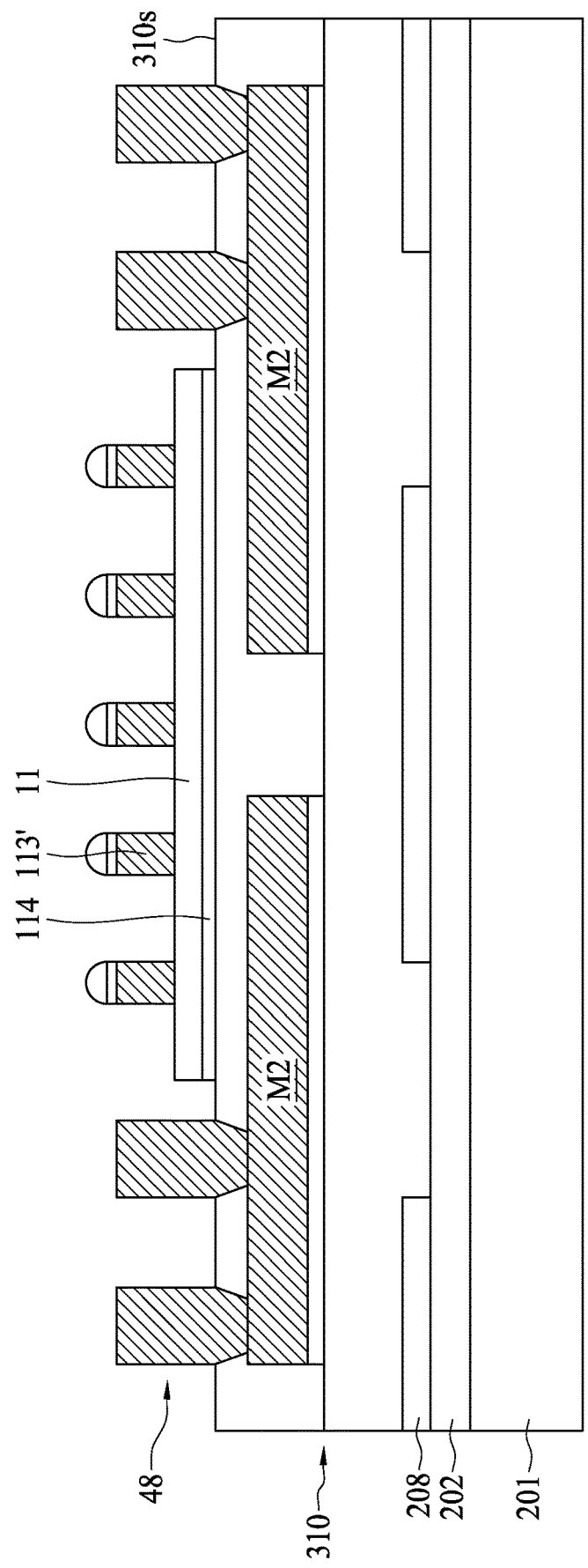
Figure 2H:
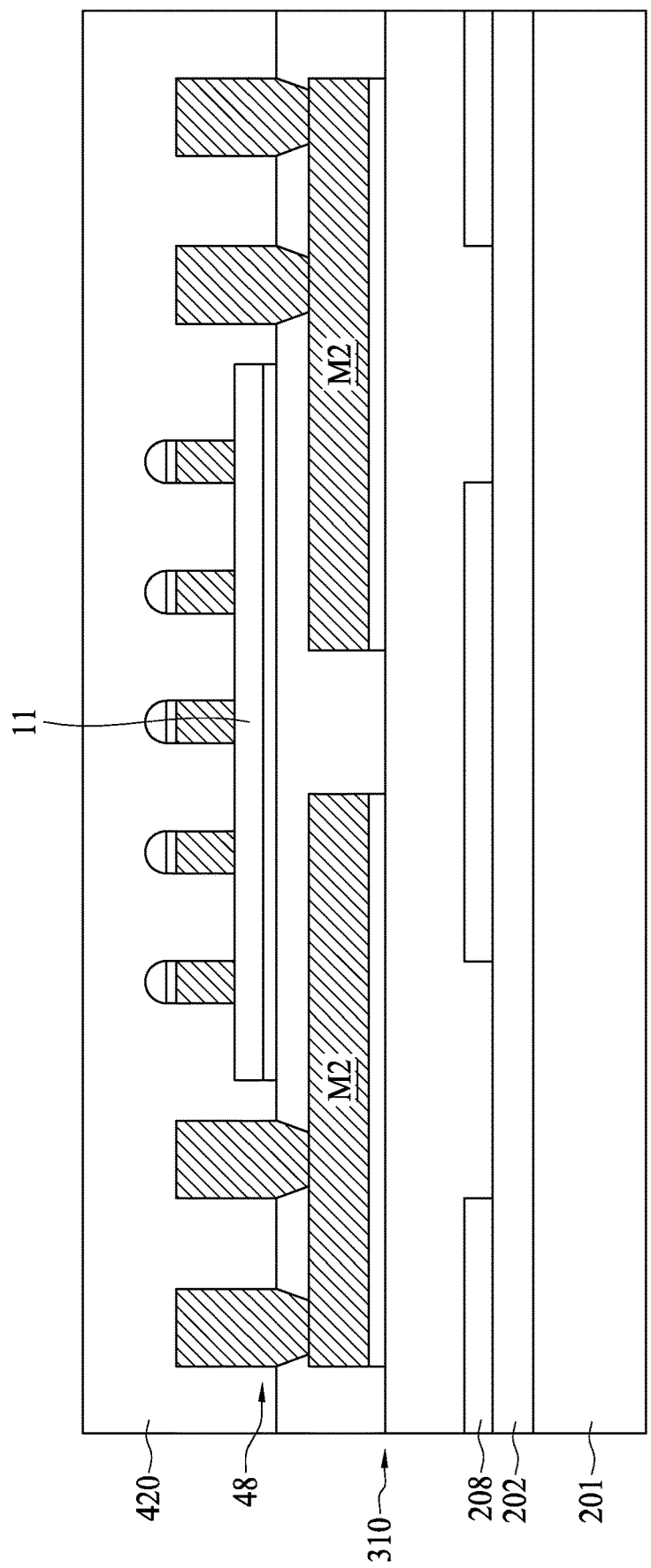
Figure 2I:
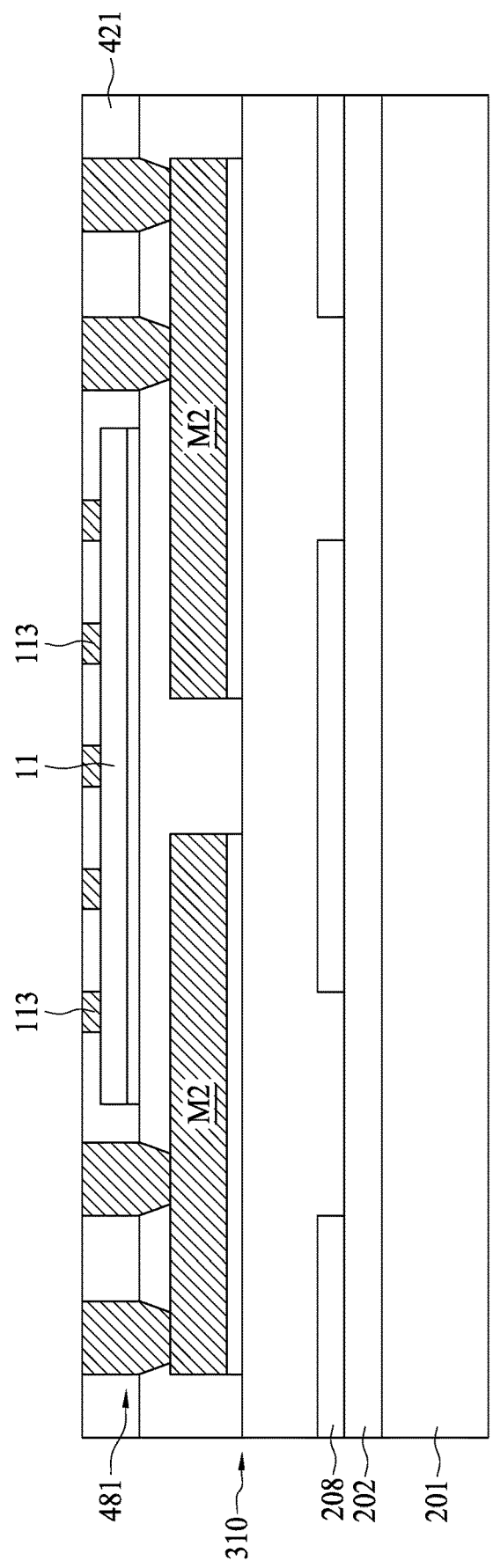
Figure 2J:
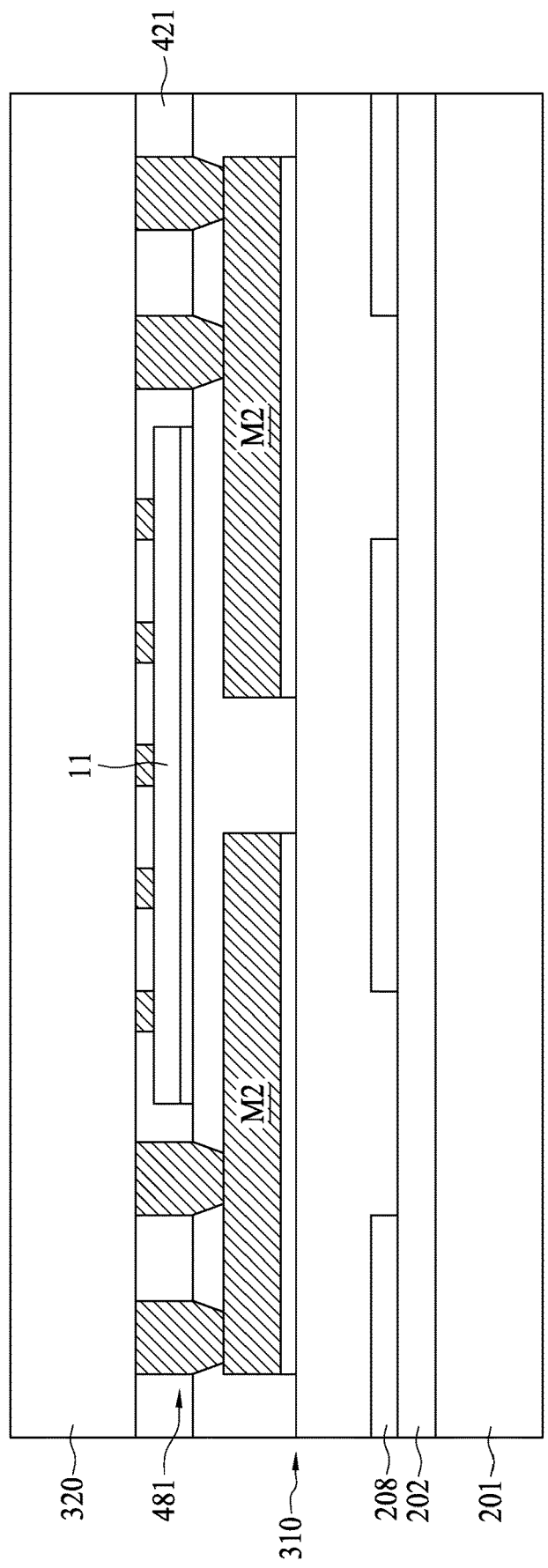
Figure 2K:
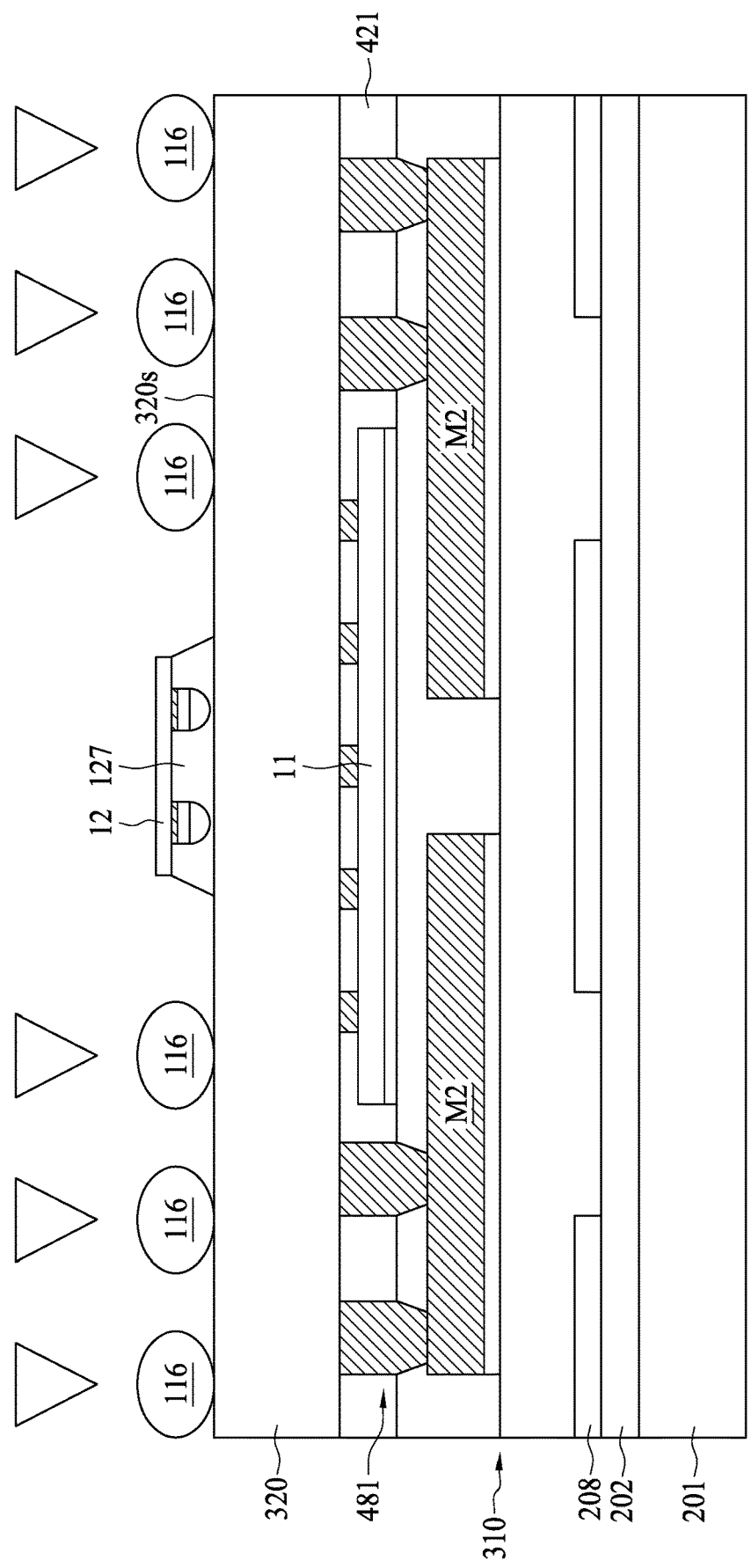
Figure 2L:
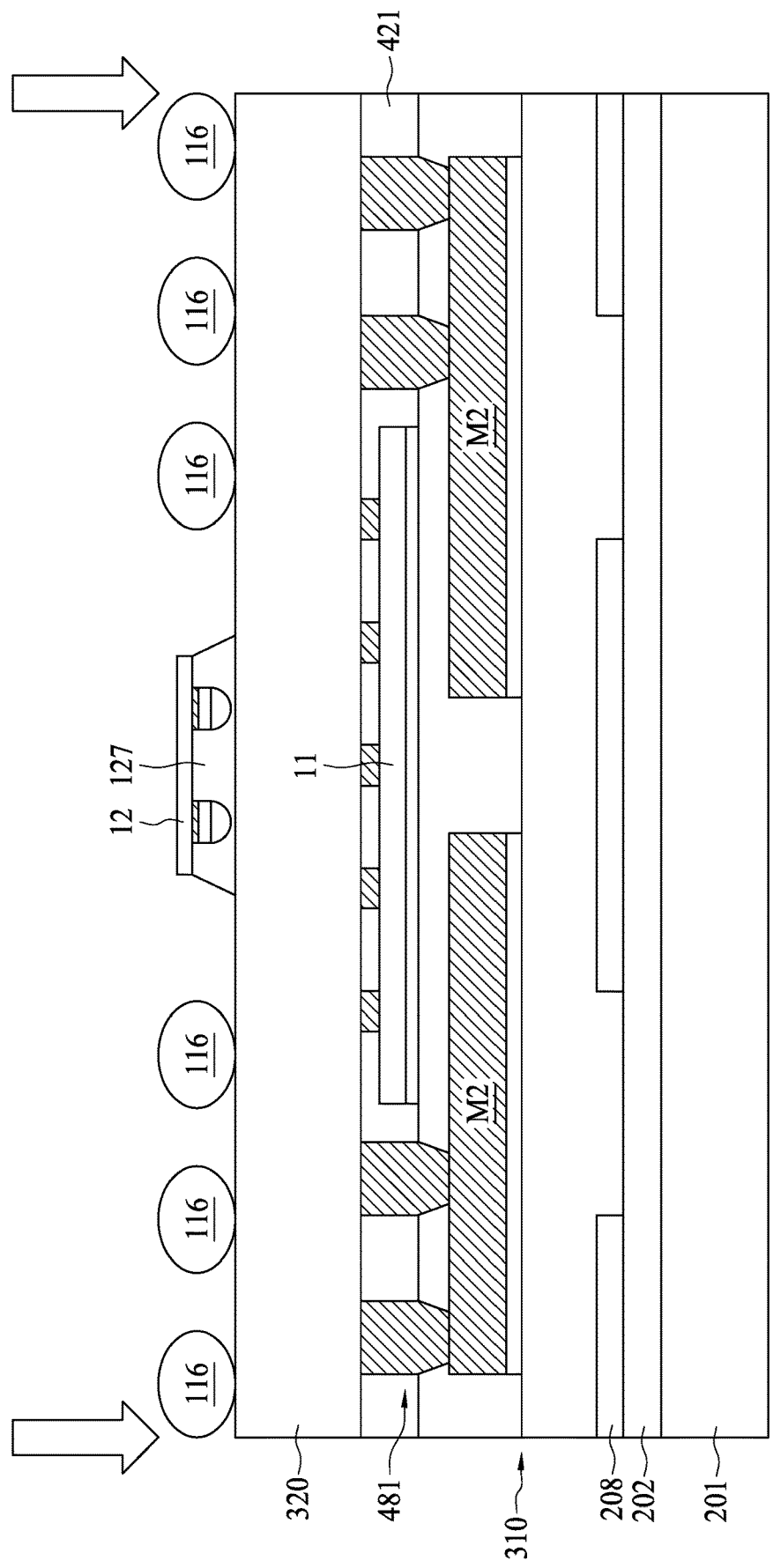
Figure 2M:
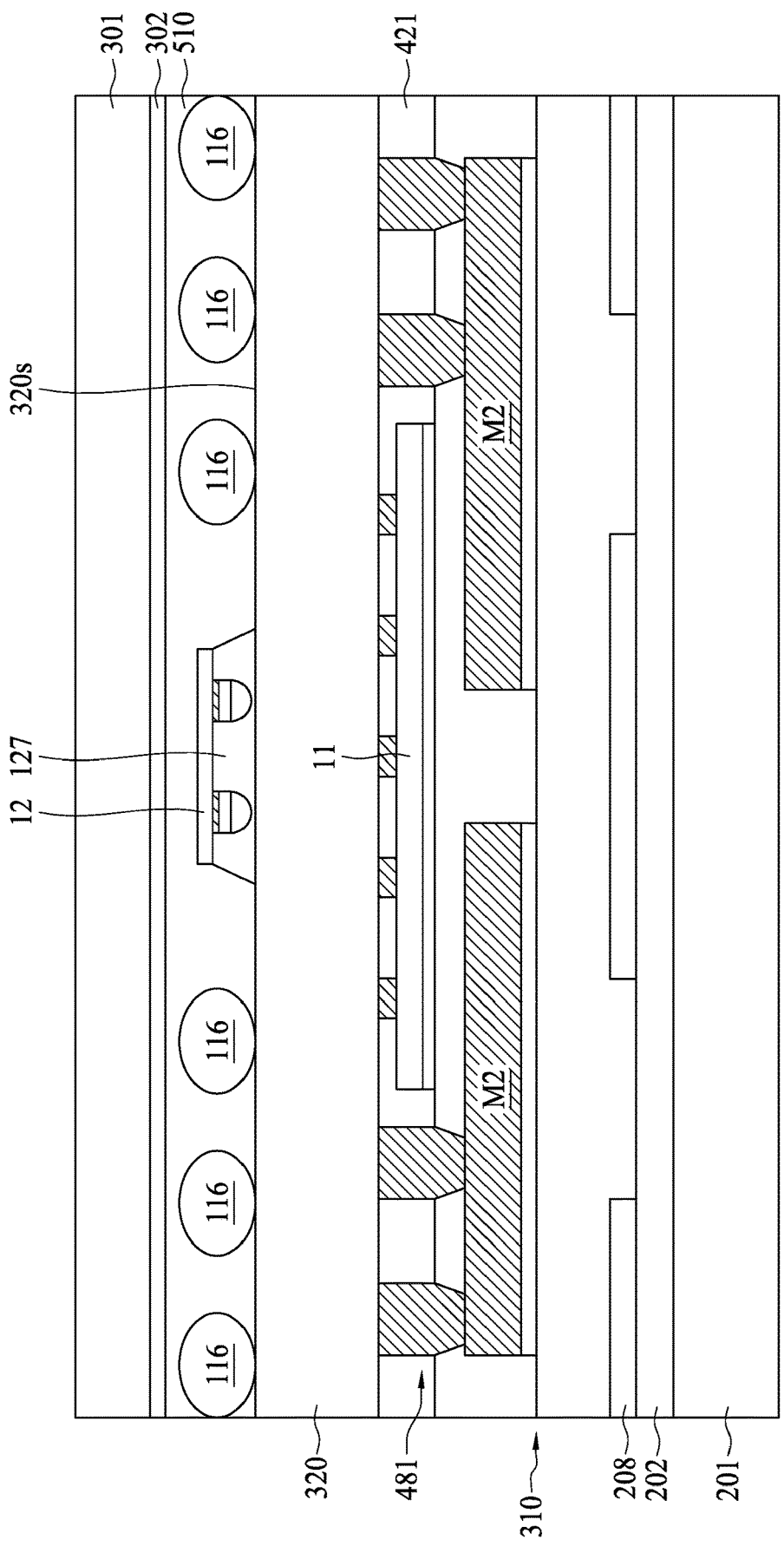
Figure 2N:
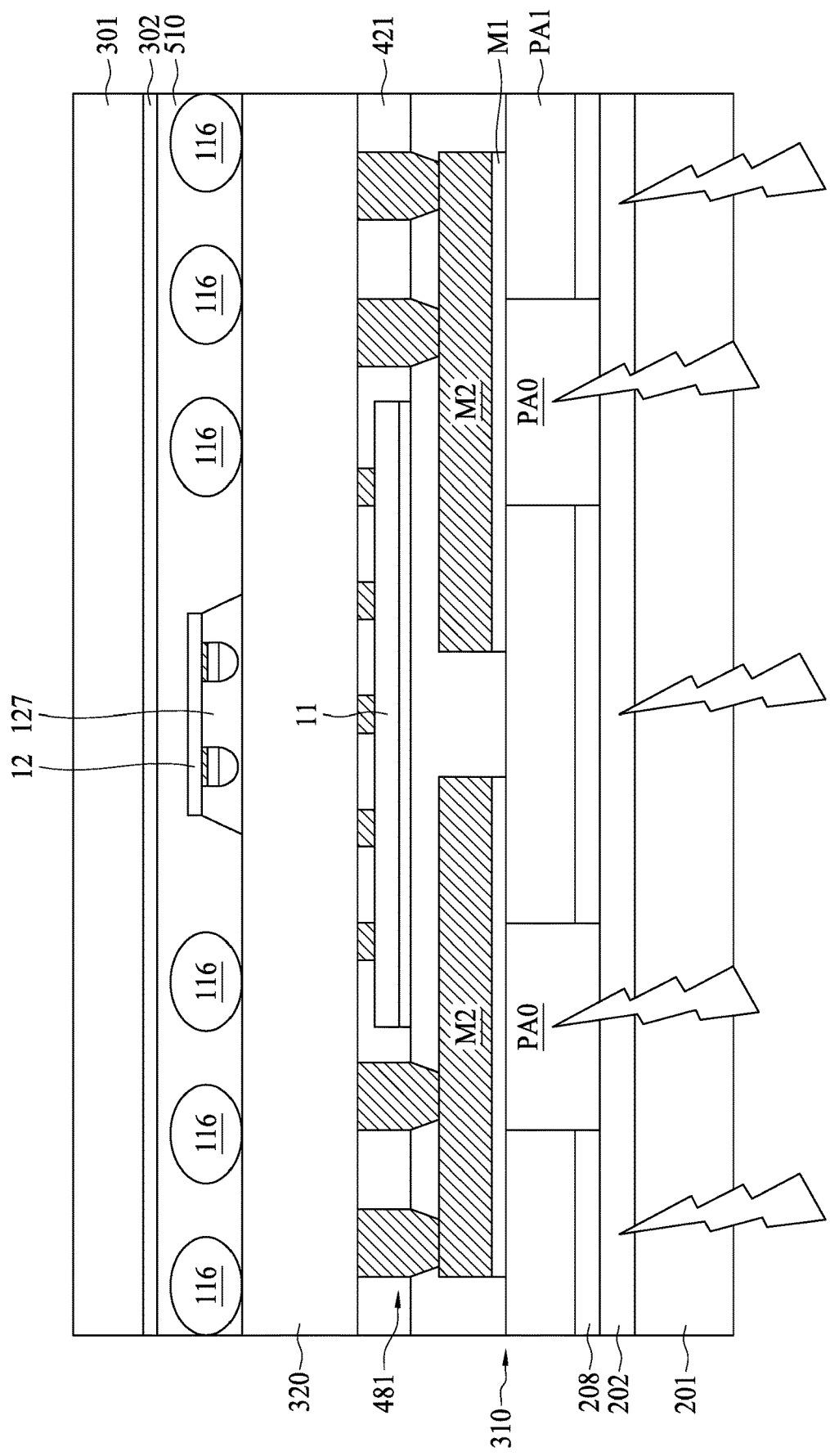
Figure 2O:
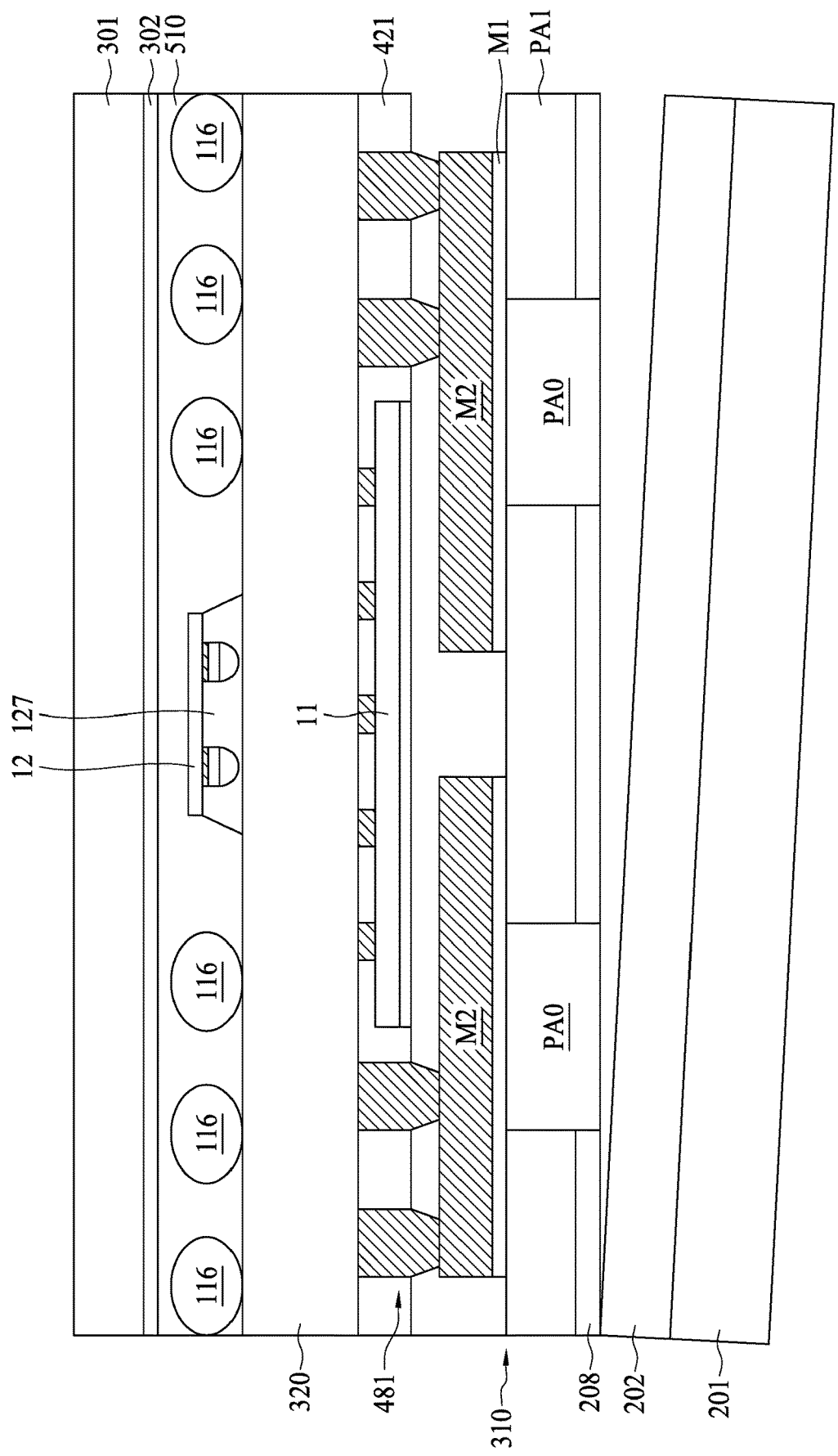
Figure 2P:
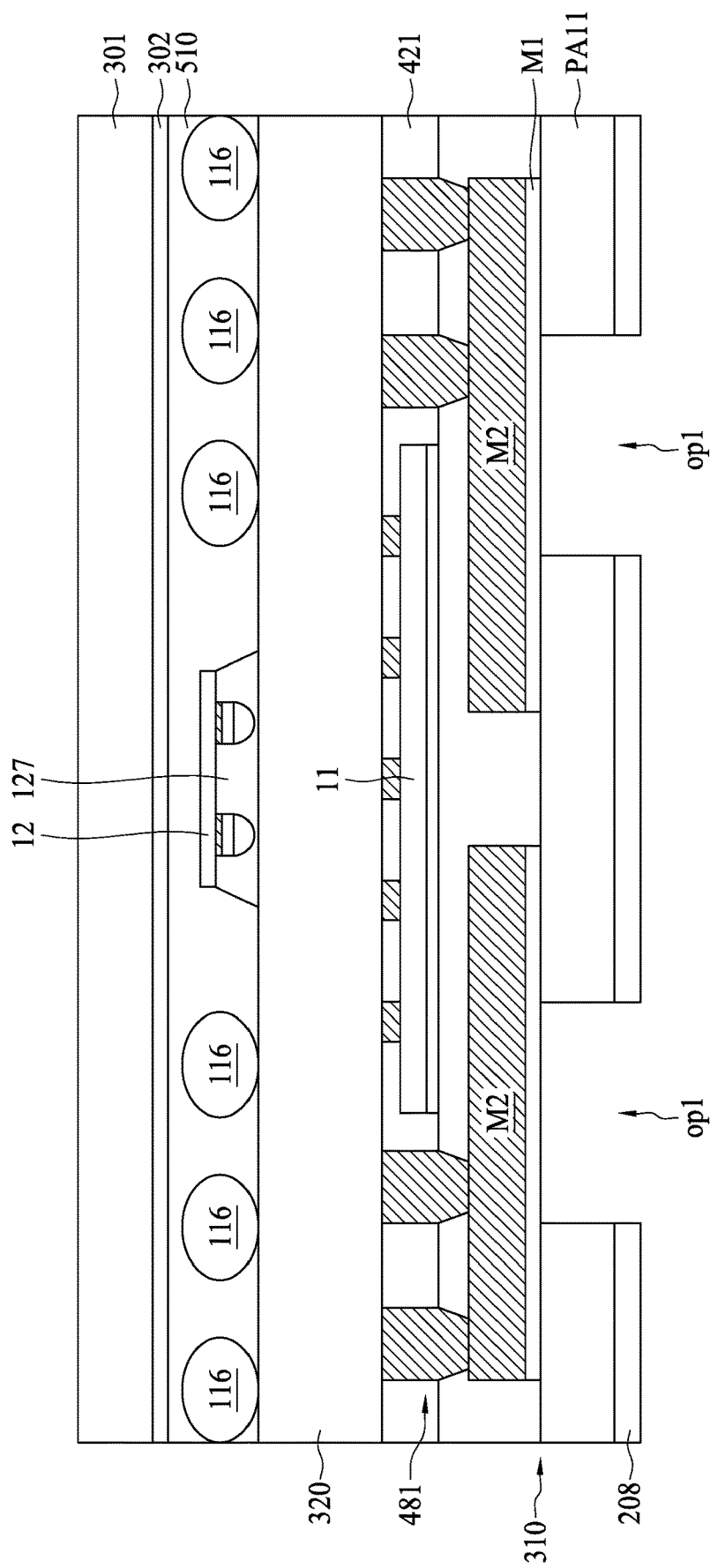
Figure 2Q:
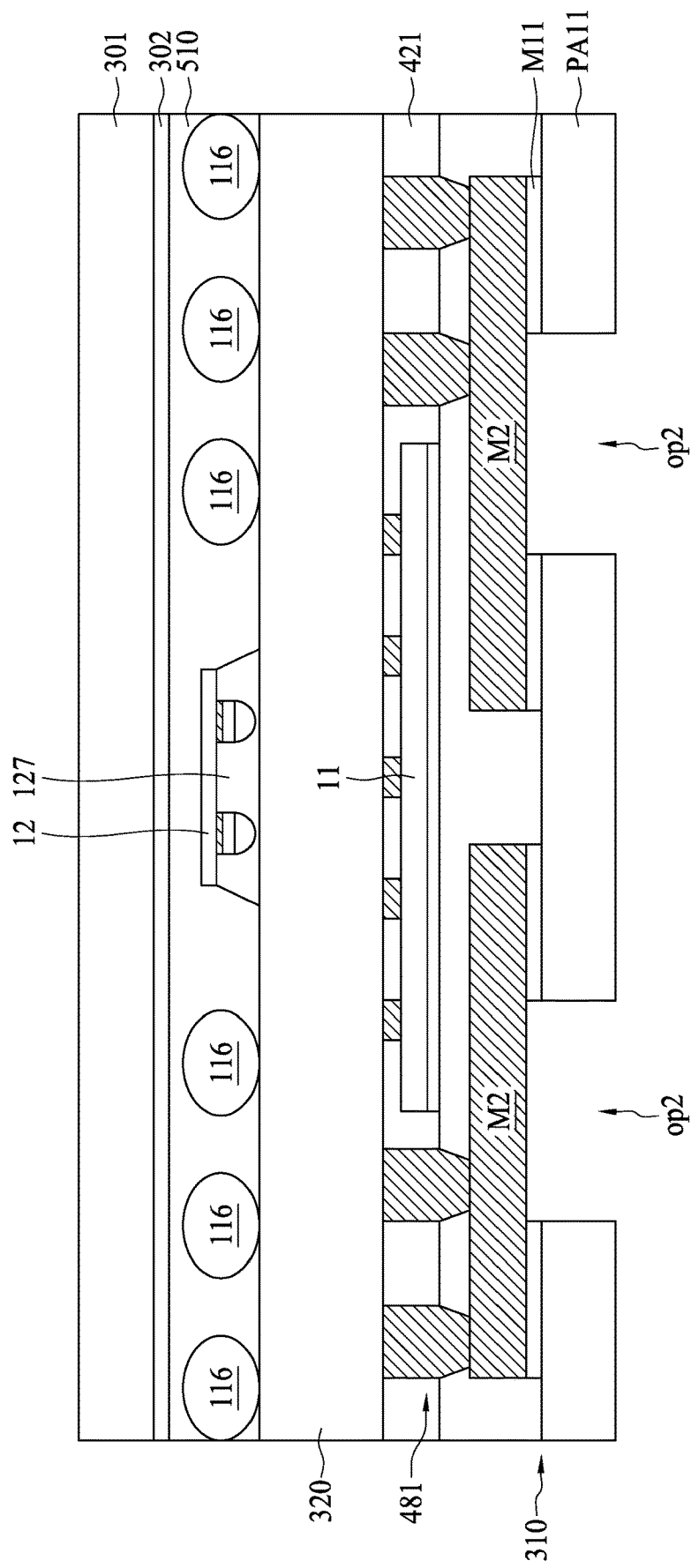
Figure 2R:
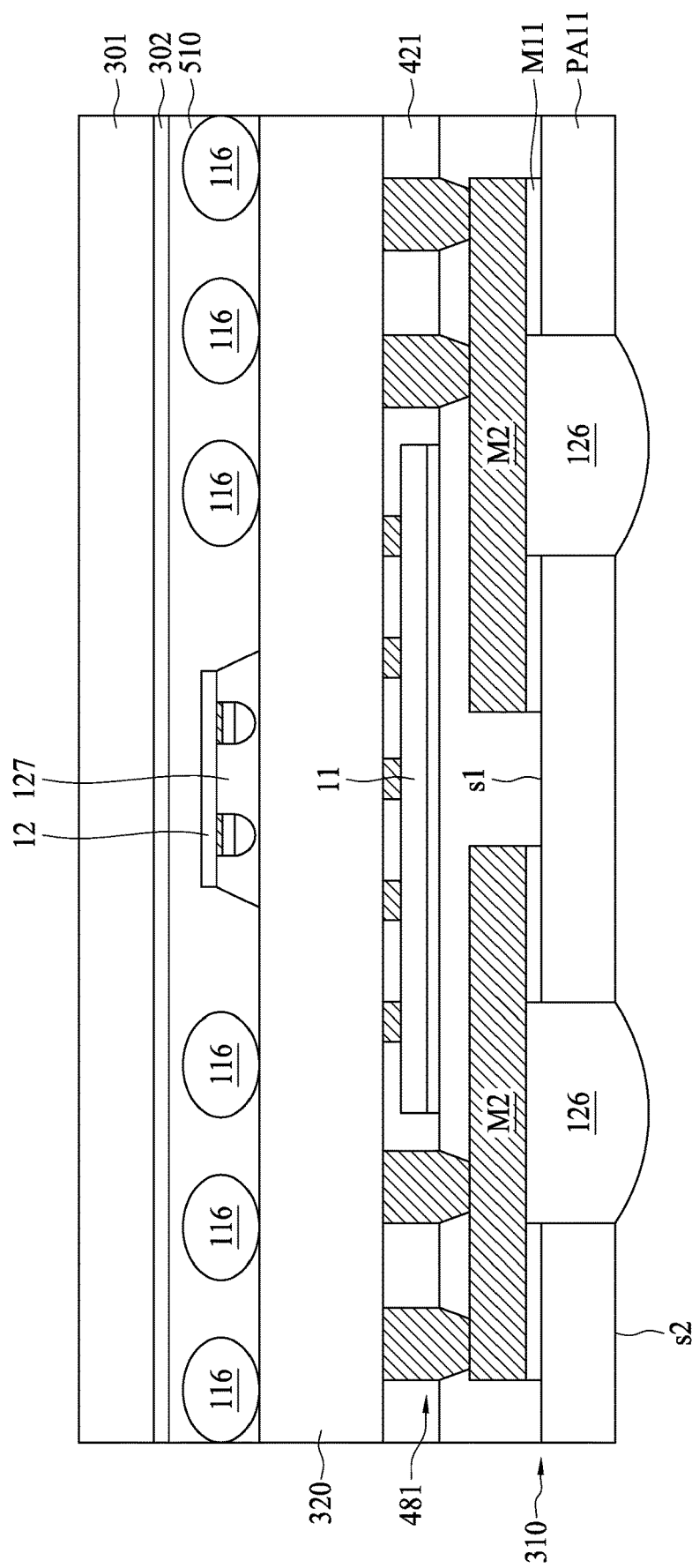
Figure 2S:
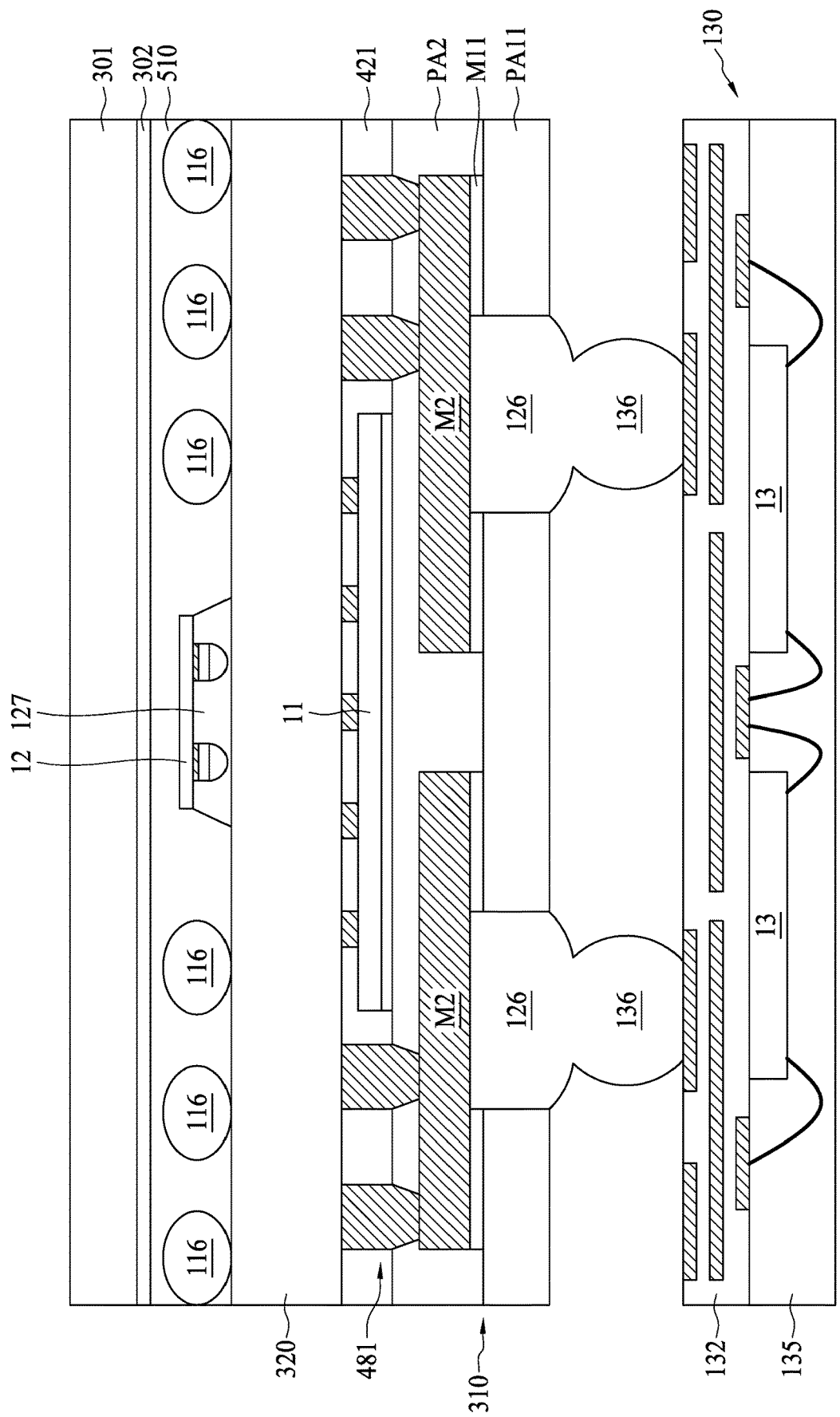
Figure 2T:
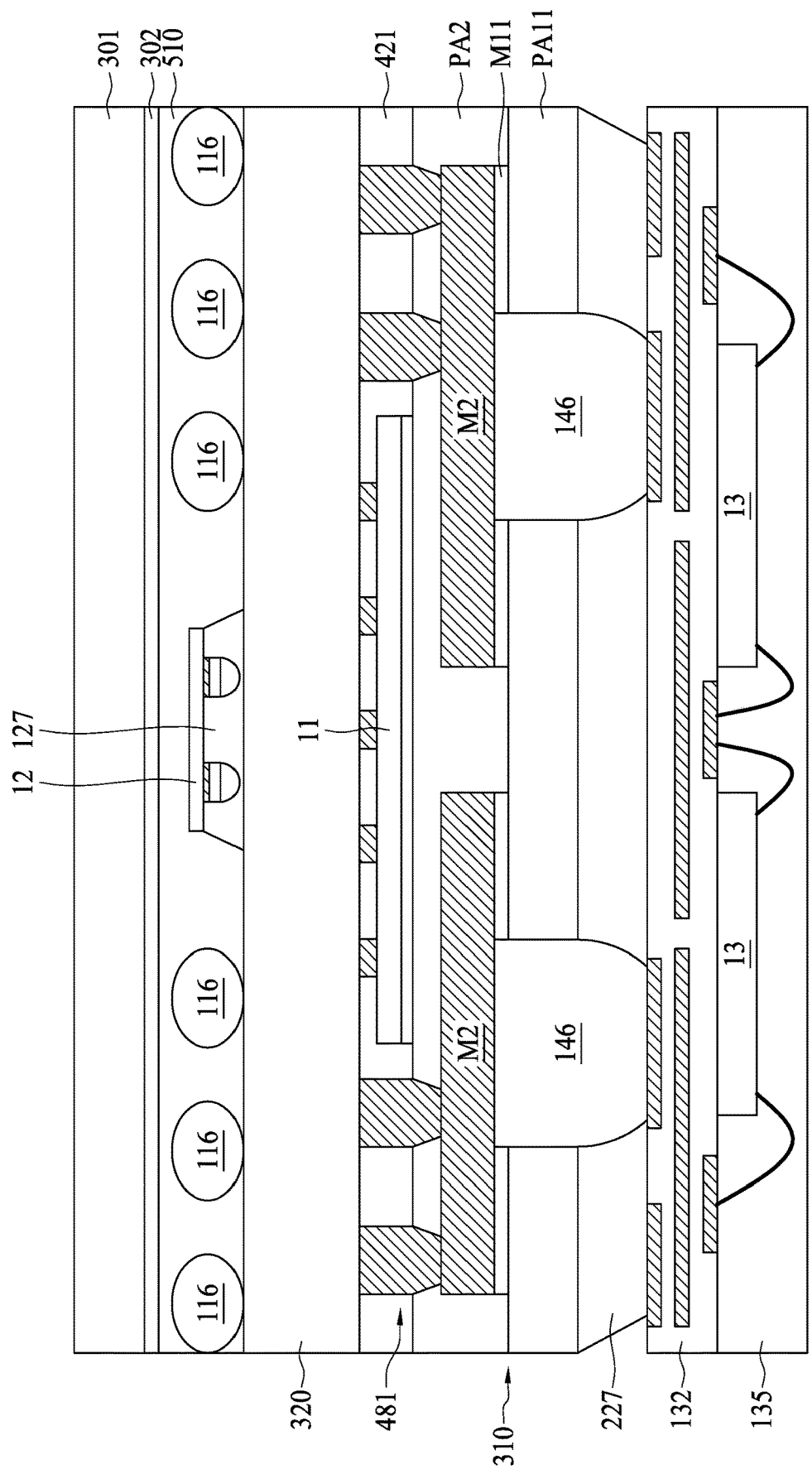
Figure 2U:
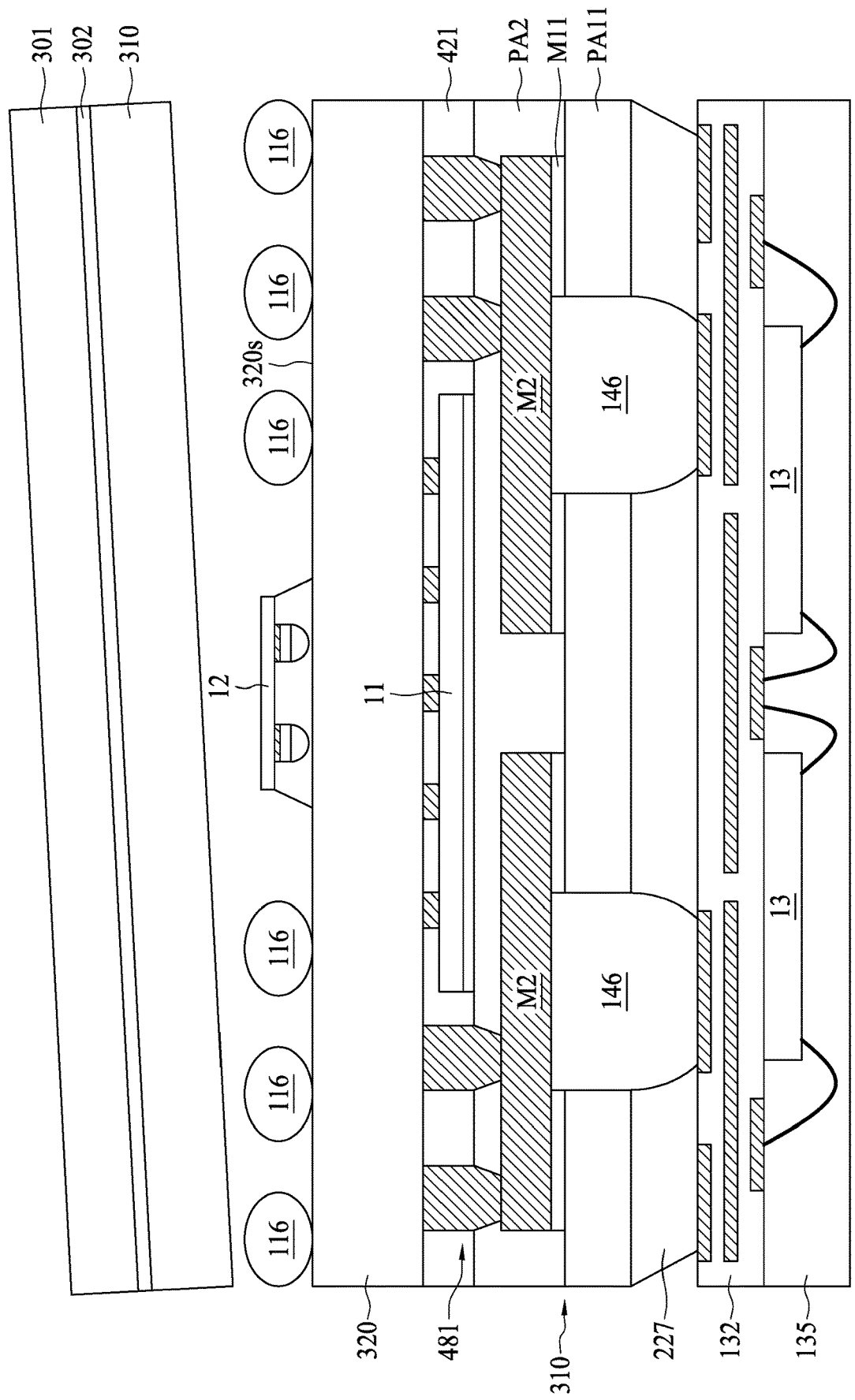

FIG. 2A through FIG. 2U are cross-sectional views each illustrating one or more stages of a method of manufacturing the semiconductor package structure 10 as described and illustrated with reference to FIG. 1A, in accordance with an embodiment of the present disclosure.

Referring to FIG. 2A, a first carrier 201 with a first release film 202 is provided. The first carrier 201 functions to support semiconductor components, devices or structures to be subsequently formed or disposed thereon. In an embodiment, the first carrier 201 includes a glass carrier having a thickness of approximately 800 micrometers (μm). The first release film 202 functions to facilitate release of the first carrier 201 from a semiconductor structure temporarily held by the first carrier 201. In an embodiment, the first release film 202 includes polymer and has a thickness of approximately 0.5 μm.

Next, a buffer layer 203 is formed on the first release film 202 by, for example, a coating process. The buffer layer 203 may include titanium (Ti), a titanium-tungsten alloy (TiW), nickel (Ni), copper (Cu), a titanium-copper alloy (TiCu), silver (Ag), gold (Au), or other suitable conductive materials. In an embodiment, the buffer layer 203 has a thickness of approximately 0.3 μm.

Referring to FIG. 2B, the buffer layer 203 is subjected to a patterning processing. A photoresist is placed on the buffer layer 203 using, for example, a spin coating technique to a height ranging from approximately 50 μm to approximately 250 μm. Once in place, the photoresist may then be patterned by exposing the photoresist via a photomask 205 to an energy source such as an ultraviolet light source (represented by dashed arrows). A developer is then applied to portions of the photoresist unmasked by the photomask 205 to selectively remove the unmasked portions, resulting in a patterned photoresist 204. The patterned photoresist 204 exposes portions 308 of the buffer layer 203. Subsequently, the exposed portions 303 of the buffer layer 203 are removed by, for example, a wet etching or dry etching process, using the patterned photoresist 204 as a mask, resulting in a patterned buffer layer 208 as illustrated in FIG. 2C. Referring to FIG. 2C, the patterned buffer layer 208 exposes portions of the release film 202 through openings 308. The patterned buffer layer 208 facilitates defining locations of electrical conductors to be subsequently formed for external connection.

Referring to FIG. 2D, a first redistribution structure 310 is formed on the patterned buffer layer 208. The first redistribution structure 310 functions to provide interconnection and may include dielectric layers and circuit layers. In the present embodiment, the first redistribution structure 310 includes two dielectric layers PA1, PA2 and one circuit layer M, constituting a "2P1M" structure. In forming the first redistribution structure 310, initially, a first dielectric layer PA1 is formed on the patterned buffer layer 208 and the exposed portions of the release film 202 by, for example, a coating process. The first dielectric layer PA1 is left unpatterned, and then a first conductive layer M1 followed by a second conductive layer M2 are formed on the first dielectric layer PM. The second conductive layer M2 is stacked on the first conductive layer M1, which together constitute the circuit layer M of the first redistribution structure 310. Subsequently, a patterned second dielectric layer PA2 is formed on the first dielectric layer PA1 and the circuit layer M, exposing portions of the second conductive layer M2 through openings 312.

In an embodiment, each of the first dielectric layer PA1 and the patterned second dielectric layer PA2 has a thickness of approximately 10 μm. The first conductive layer M1 has a thickness ranging from approximately 0.1 μm to approximately 0.2 μm. The second conductive layer M2 has a thickness ranging from approximately 3 μm to approximately 7 μm.

By comparison, in some approaches in manufacturing a semiconductor package structure, which will be further discussed with reference to FIGS. 4A to 4P, a buffer layer corresponding to the buffer layer 203 of the present disclosure is not patterned. Moreover, a first dielectric layer in a redistribution structure, corresponding to the first dielectric layer PA1 of the present disclosure, is patterned, exposing portions of the unpatterned buffer layer. As a result, in these approaches the unpatterned buffer layer is in electrical connection at the exposed portions with a circuit layer later formed in the patterned first dielectric layer in the redistribution structure. Such configuration may adversely affect a subsequent electrical testing. During a testing stage, a testing signal is applied through a solder ball later formed over the redistribution structure towards the circuit layer. However, since the unpatterned buffer layer and the circuit layer are electrically connected, the testing signal may then be routed by the unpatterned buffer layer via the redistribution structure towards a different solder ball, resulting in severe interference. The worst case may even lead to a 0% test yield. Furthermore, in view of the fact that the unpatterned buffer layer would interfere in testing, in these approaches the electrical testing may be conducted at a later time when the unpatterned buffer layer is removed. In that case, which will be further discussed with reference to FIGS. 5A to 5E, additional bonding and debonding processes plus additional carriers are included, inevitably increasing the manufacturing cost.

In the present disclosure, unlike the above-mentioned approaches, the first dielectric layer PA1 is not patterned before the testing. The unpatterned first dielectric layer PA1 electrically isolates the patterned buffer layer 208 from the circuit layer M. Specifically, none of the first conductive layer M1 or the second conductive layer M2 is electrically connected to the patterned buffer layer 208. As a result, the interference that would occur in the approaches during a testing stage is prevented.

In an embodiment, the first dielectric layer PA1 may include organic materials, for example, a molding compound, polyamide (PA), polyimide (PI), polybenzoxazole (PBO) or an epoxy-based material. In another embodiment, the first dielectric layer PA1 may include inorganic materials, for example, silicon oxide (SiOx), silicon nitride (SiNx) or tantalum oxide (TaOx). In addition, the patterned second dielectric layer PA2 may include organic materials, for example, a molding compound, PA, PI, PBO or an epoxy-based material. Moreover, the patterned second dielectric layer PA2 may include inorganic materials, for example, SiOx, SiNx or TaOx. The material of the first dielectric layer PA1 may be the same as or different from the material of the second dielectric layer PA2.

The first conductive layer M1 may serve as a seed layer. In an embodiment, the first conductive layer M1 includes titanium (Ti), a titanium-tungsten alloy (TiW), nickel (Ni), copper (Cu), a titanium-copper alloy (TiCu), silver (Ag), gold (Au) or other suitable conductive materials. The second conductive layer M2 may include Cu, silver (Ag), gold (Au) or other suitable conductive materials. In some embodiments, the material of the first conductive layer M1 is the same as that of the patterned buffer layer 208, which further facilitates defining the locations of electrical conductors to be subsequently formed for external connection, as will be later described in detail.

Referring to FIG. 2E, a patterned conductive layer 48 is formed on a surface 310s of the first redistribution structure 310. An exemplary process of forming the patterned conductive layer 48 includes forming a patterned dry film 410 on the surface 310s of the first redistribution structure 310, exposing portions of the second conductive layer M2 through the openings 312, and disposing a conductive material onto the surface 310s at the exposed portions by plating. In an embodiment, the patterned dry film 410 includes an acrylic film having a thickness of approximately 240 µm. In addition, the patterned conductive layer 48 includes copper and has a thickness between approximately 170 µm and 240 µm. After the patterned conductive layer 48 is formed, the patterned dry film 410 is removed, resulting in the patterned conductive layer 48 as illustrated in FIG. 2F.

Referring to FIG. 2G, a first semiconductor device 11 with conductive studs 113' is disposed on the surface 310s of the first redistribution structure 310 by a pick-and-place process. The first semiconductor device 11 includes an application processor. An adhesive film 114 may be used to facilitate attaching the first semiconductor device 11 to the first redistribution structure 310.

Referring to FIG. 2H, an encapsulating layer 420 is formed on the first redistribution structure 310, covering the patterned conductive layer 48, the first semiconductor device 11 and the conductive studs 113'. The encapsulating layer 420 may include a molding compound.

Referring to FIG. 2I, the encapsulating layer 420 is then reduced in height by, for example, a grinding process such as a mechanical polishing process, resulting in a reduced encapsulating layer 421. The grinding process also reduces the patterned conductive layer 48 and the conductive studs 113' in height, resulting in a patterned conductive layer 481 and conductive studs 113, respectively. The patterned conductive layer 481 functions to provide interconnection for the first semiconductor device 11. In an embodiment, the patterned conductive layer 481 has a thickness of approximately 170 µm. Moreover, the conductive studs 113 serve as input/output (I/O) pads of the first semiconductor device 11, and have a thickness of approximately 25 µm.

Subsequently, after the encapsulating layer 420 is reduced, a second redistribution structure 320 is formed on the reduced encapsulating layer 421, as illustrated in FIG. 2J. The second redistribution structure 320 may include dielectric layers stacked on each other over the first semiconductor device 11, and include circuit layers in the dielectric layers to provide electrical connection between the first semiconductor device 11 and electrical conductors to be later formed on the second redistribution structure 320. In an embodiment, the second redistribution structure 320 includes a "4P4M" configuration.

Referring to FIG. 2K, electrical conductors 116 are mounted on a surface 320s of the second redistribution structure 320 over the reduced encapsulating layer 421. In addition, a second semiconductor device 12 is mounted on the surface 320s of the second redistribution structure 320. The electrical conductors 116 provide electric connection between the first semiconductor device 11 and an external semiconductor device or component (not shown). The electrical connectors 116 may include solder balls, which may be arranged in a ball grid array "BGA". The electrical connectors 116 may include controlled collapse chip connection (C4) bumps, including lead based or lead-free bumps or balls. The second semiconductor device 12 includes an integrated passive device, which in turn may include a resistor, a capacitor, an inductor or a combination thereof. In the present embodiment, the second semiconductor device 12 is die-down attached onto the surface 320s of the second redistribution structure 320. An underfill 127 is applied between the second semiconductor device 12 and the second redistribution structure 320. The underfill 127 provides protection of the second semiconductor device 12 from moisture, ionic contaminants, radiation, and hostile operating environments with thermal, mechanical, shock, and vibration stresses.

Subsequently, a wafer level function test (represented by triangles) is performed to determine if electric performance of semiconductor structures in a wafer manufactured so far on the carrier 201 is desirable. If affirmative, then in FIG. 2L, edges of the wafer are trimmed (indicated by arrows showing movement) to remove excessive encapsulating material to facilitate a subsequent bonding process.

Referring to FIG. 2M, an adhesive layer 510 is formed on the surface 320s of the second redistribution structure 320, covering the second semiconductor device 12 and the electrical conductors 116. Next, a second carrier 301 with a second release film 302 is bonded onto the adhesive layer 510. The adhesive layer 510 may include glue, which facilitates attaching the second carrier 301 to the second redistribution structure 320. The second carrier 301 and the second release film 302 include similar or the same materials as the first carrier 201 and the first release film 202, respectively, as described and illustrated with reference to FIG. 2A, and have a similar or the same dimension as the first carrier 201 and the first release film 202, respectively.

Referring to FIG. 2N, after the second carrier 301 with the second release film 302 is bonded, the first carrier 201 and the first release film 202 are removed by a de-bonding process, including, for example, a mechanical, chemical, thermal or laser-based de-bonding process. In the present embodiment, a laser de-bonding process using a 308 nm excimer laser is employed. Laser light (represented by thunderbolts) is introduced from the first carrier 201 side. Portions PA0 of the first dielectric layer PA1, which are unmasked by the patterned buffer layer 208, are exposed to the laser light via the transparent first carrier 201. The exposed portions PA0 subjected to laser radiation are gently de-bonded from the first carrier 201.

Next, referring to FIG. 2O, the first carrier 201 and the first release film 202 are removed, exposing the patterned buffer layer 208 and the de-bonded portions PA0 of the first dielectric layer PM. The de-bonded portions PA0 of the first dielectric layer PA1 are subsequently removed, resulting in a patterned first dielectric layer PA11 as illustrated in FIG. 2P. Referring to FIG. 2P, the patterned first dielectric layer PA11 exposes portions of the first conductive layer M1 through openings op1. The opening op1, where the de-bonded portion PA0 is located before removed, is defined by the patterned buffer layer 208, the patterned first dielectric layer PA11 and the first conductive layer M1.

Referring to FIG. 2Q, the patterned buffer layer 208 and the exposed portions of the first conductive layer M1 are removed, resulting in a patterned first conductive layer M11. The patterned first conductive layer M11 exposes portions of the second conductive layer M2. In an embodiment, the patterned buffer layer 208 and the first conductive layer M1 include substantially the same material and thus may be removed at the same time by, for example, an etching process. Consequently, a recess op2, defined by the patterned first dielectric layer PA11 and the patterned first conductive layer M11, for holding or accommodating an electrical conductor is formed. Specifically, the recess op2 is defined by the exposed portions of the second conductive layer M2 as well as the patterned first dielectric layer PA11 and the patterned first conductive layer M11.

Referring to FIG. 2R, electrical conductors 126 are formed on a second surface s2, which is opposite to the first surface s1, of the patterned first redistribution structure PA11 by a pre-soldering process, filling the recess op2 defined by the patterned first dielectric layer PA11 the patterned first conductive layer M11 and the exposed portions of the second conductive layer M2.

Referring to FIG. 2S, a packaged device 130 is provided. The packaged device 130 includes one or more third semiconductor devices 13, electrical conductors 136 and a redistribution structure 132. The third semiconductor devices 13 are sealed in an encapsulating layer 135. The redistribution structure 132, disposed between the encapsulating layer 135 and the electrical conductors 1136, provides electric connection of the semiconductor devices 13 through the electrical conductors 136 to another semiconductor device. The electrical conductors 126 on the surface p1s of the patterned first dielectric layer PA11 and the electrical conductors 136 of the packaged device 130 are jointed together by a reflowing process, resulting in electrical conductors 146, as illustrated in FIG. 2T. Referring to FIG. 2T, an underfill 227 is then applied between the first redistribution structure 310 and the packaged device 130. The underfill 227 provides protection of the third semiconductor devices 13 from moisture, ionic contaminants, radiation, and hostile operating environments with thermal, mechanical, shock, and vibration stresses.

Subsequently, referring to FIG. 2U, the second carrier 301 is removed by, for example, a laser de-bonding process, with the help of the second release film 302. The adhesive layer 510 is then also removed, exposing the electrical conductors 116 and the second semiconductor device 12 on the surface 320s of the second redistribution structure 320. Next, a singulation process is performed to saw the wafer into individual device units, each being similar to or the same as the semiconductor device package 10 as described and illustrated with reference to FIG. 1A.

FIG. 3A through FIG. 3K are cross-sectional views each illustrating one or more stages of a method of manufacturing the semiconductor package structure 20 as described and illustrated with reference to FIG. 1B, in accordance with an embodiment of the present disclosure.

Figure 3A:
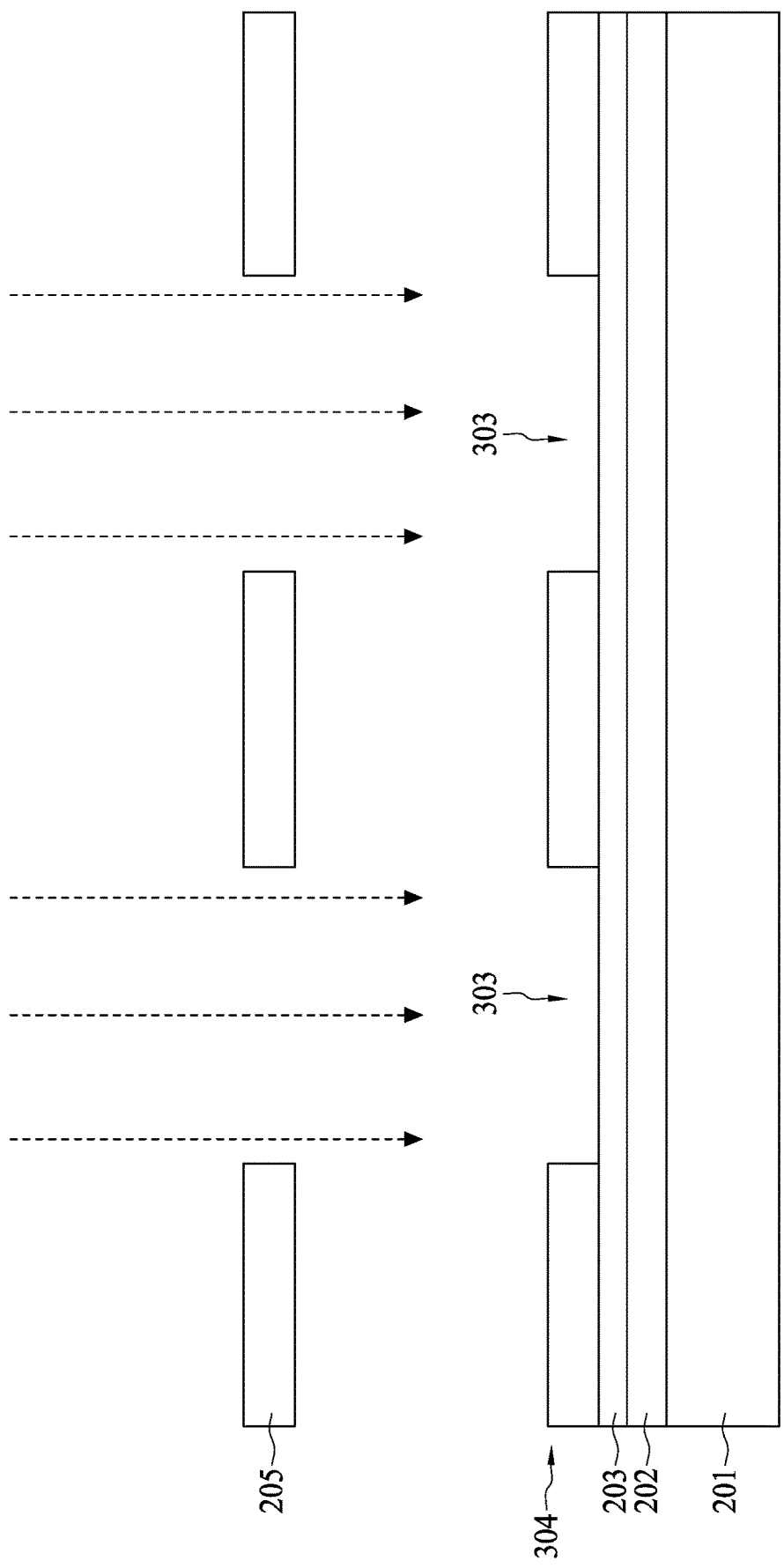

Referring to FIG. 3A, after forming a buffer layer 203 over the first carrier 201, the buffer layer 203 is subjected to a patterning processing. Initially, similar to forming the patterned photoresist as described and illustrated with reference to FIG. 2B, a patterned passivation layer 304 is formed, using a mask 205, on the buffer layer 203 by, for example, a coating process followed by an exposure and developing treatment. Thereafter, the patterned passivation layer 304 is cured. In an embodiment, the patterned passivation layer 304 includes polyimide. In addition, the patterned passivation layer 304 has a thickness of approximately 7 μm. Subsequently, portions of the buffer layer 203 exposed by the patterned passivation layer 304 from the openings 303 are removed by, for example, a wet etching or dry etching process, using the patterned passivation layer 304 as a mask, resulting in a patterned buffer layer 208 as illustrated in FIG. 3B. The patterned passivation layer 304 and the patterned buffer layer 208 expose portions of the first release film 202 from the openings 303. The patterned buffer layer 208 facilitates defining locations of electrical conductors to be subsequently formed for external connection. Similarly, the patterned passivation layer 304 facilitates defining the locations of the electrical conductors.

Figure 3C:
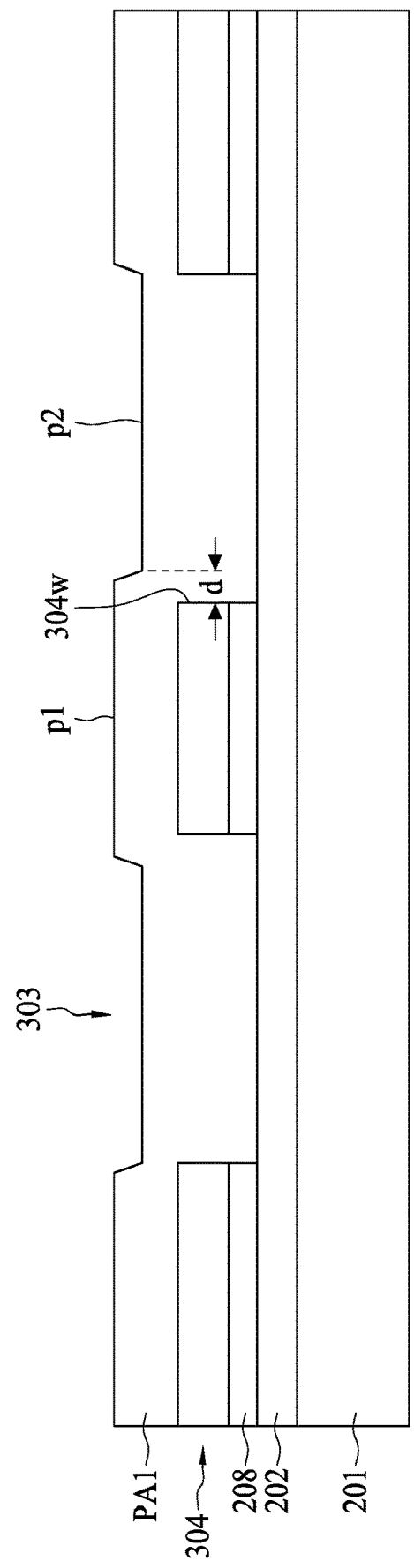

Referring to FIG. 3C, a first dielectric layer PA1 of the first redistribution structure 310 is formed on the patterned passivation layer 304 and the exposed portions of the first release film 202 by, for example, a coating process. The first dielectric layer PA1 is left unpatterned until a testing has been conducted. The first dielectric layer PA1 is conformal to the contour of the patterned passivation layer 304. Such conformal topology is not significant in the embodiment described and illustrated with reference to FIG. 1D and thus is not specifically depicted, in view of the fact that the exemplary thickness of the patterned buffer 208 is 0.3 while the first dielectric layer PA1 thereon is 10 μm. In the present embodiment of FIG. 3C, however, with the 7 μm patterned passivation layer 304, conformal topology is relatively significant. As shown in FIG. 3C, the conformal topology renders the first dielectric layer PA1 to gradually descend from a first turning point at an upper surface p1 towards a second turning point at a lower surface p2, and then ascend vice versa. In a cross-sectional view, a distance d thus exists between a sidewall 304w of the patterned passivation layer 304 and the second turning point in a lateral direction. Also referring to FIG. 1B, the distance d determines the amount of a patterned first conductive layer M11 that can extend over the sidewall 304w into a recess op4, which will become clear and comprehensible by referring to the descriptions below.

Figure 3D:
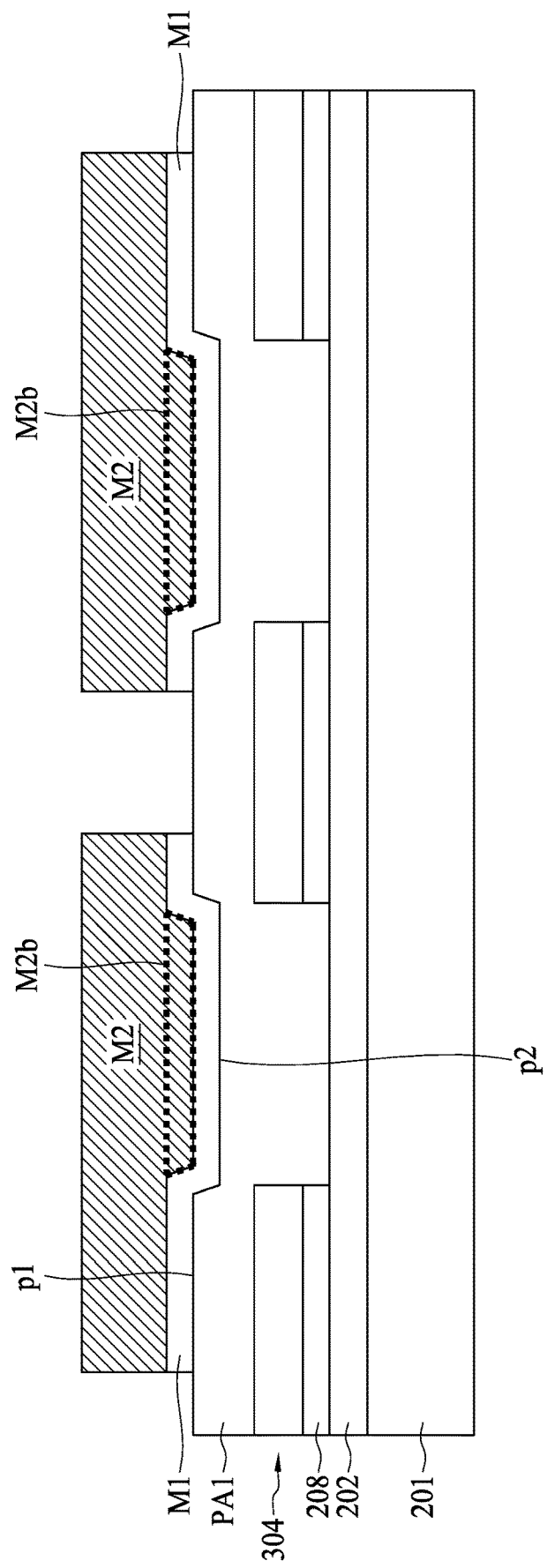

Referring to FIG. 3D, a first conductive layer M1 followed by a second conductive layer M2 are formed on the first dielectric layer PA1. The second conductive layer M2 is stacked on the first conductive layer M1, which together constitute the circuit layer M of the first redistribution structure 310. As a thin film, the first conductive layer M1 is conformal to the first dielectric layer PA1 and follows the contour. Specifically, a first portion of the first conductive layer M1 is disposed on the upper surface p1 of the first dielectric layer PA1, and a second portion of the first conductive layer M1 is disposed on the lower surface p2 of the first dielectric layer PM. As to the second conductive layer M2, conformal topology is insignificant because the second conductive layer M2 is remarkably thicker than the first conductive layer M1, given the exemplary dimensions previously discussed with reference to FIG. 2D. As a result, as the second conductive layer M2 is formed on the first conductive layer M1, a portion of the second conductive layer M2, hereinafter referred to as a bulge portion M2b, is disposed on the second portion of the first conductive layer M1.

Figure 3E:
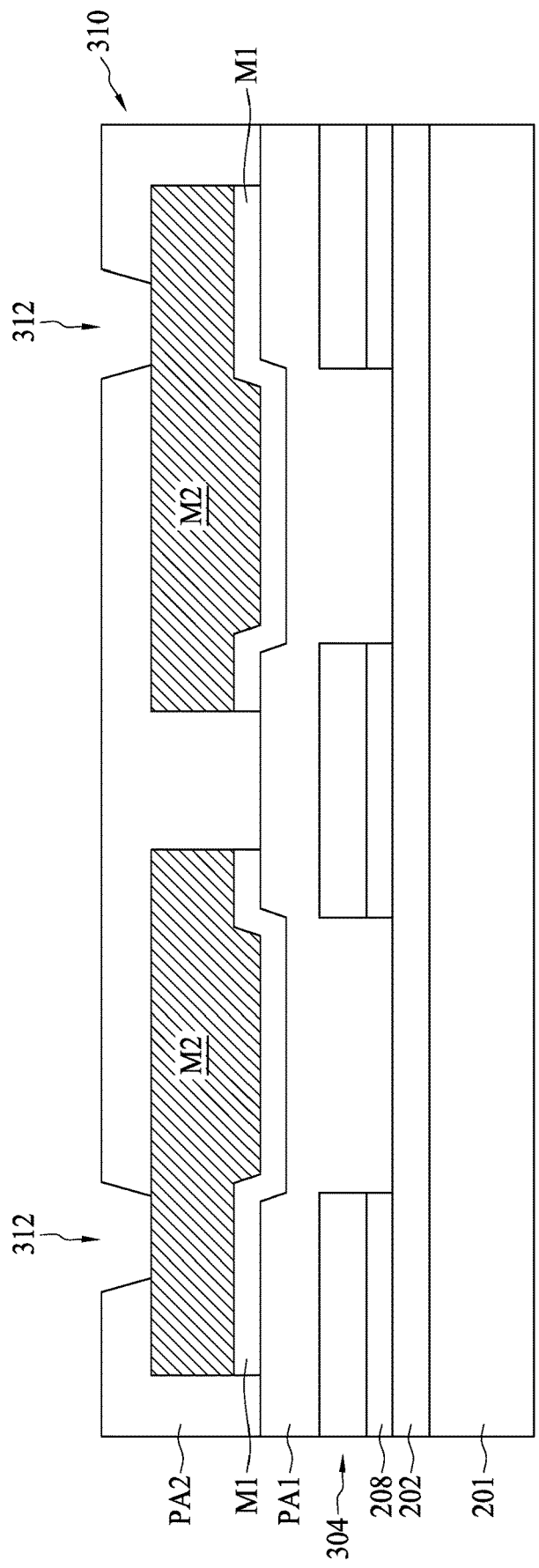

Subsequently, referring to FIG. 3E, a patterned second dielectric layer PA2 is formed on the first dielectric layer PA1 and the circuit layer M, exposing portions of the second conductive layer M2 through openings 312.

Figure 3F:
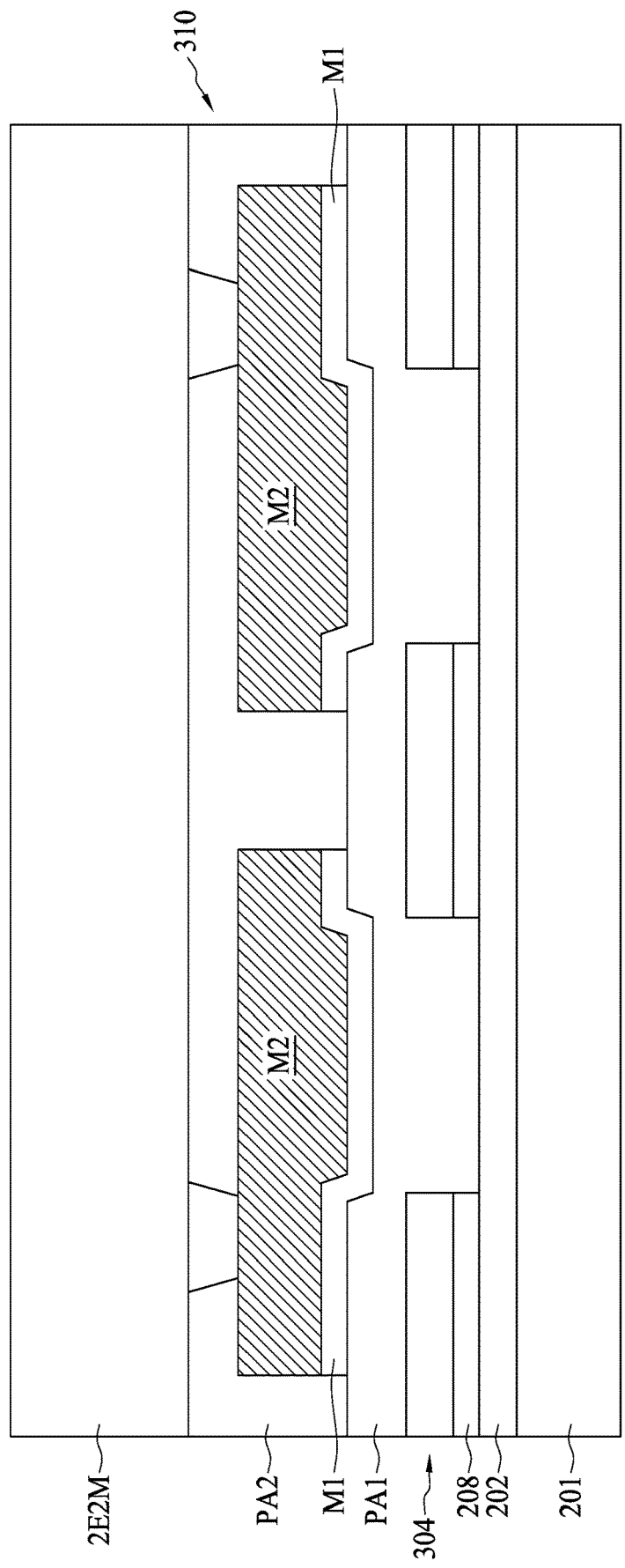

Referring to FIG. 3F, other semiconductor components, devices and structures, as those described and illustrated with reference to FIGS. 2E through 2M, are then formed or disposed on or over the first redistribution structure 310. It is noted that a testing on the performance of the semiconductor package structure 20 under manufacturing has been conducted. Exemplary fabrication processes, materials and dimensions for these components, devices and structures can be found in the embodiments in FIGS. 2E through 2M. These semiconductor components, devices and structures, collectively represented by a box labeled 2E2M, are therefore not further discussed.

Figure 3G:
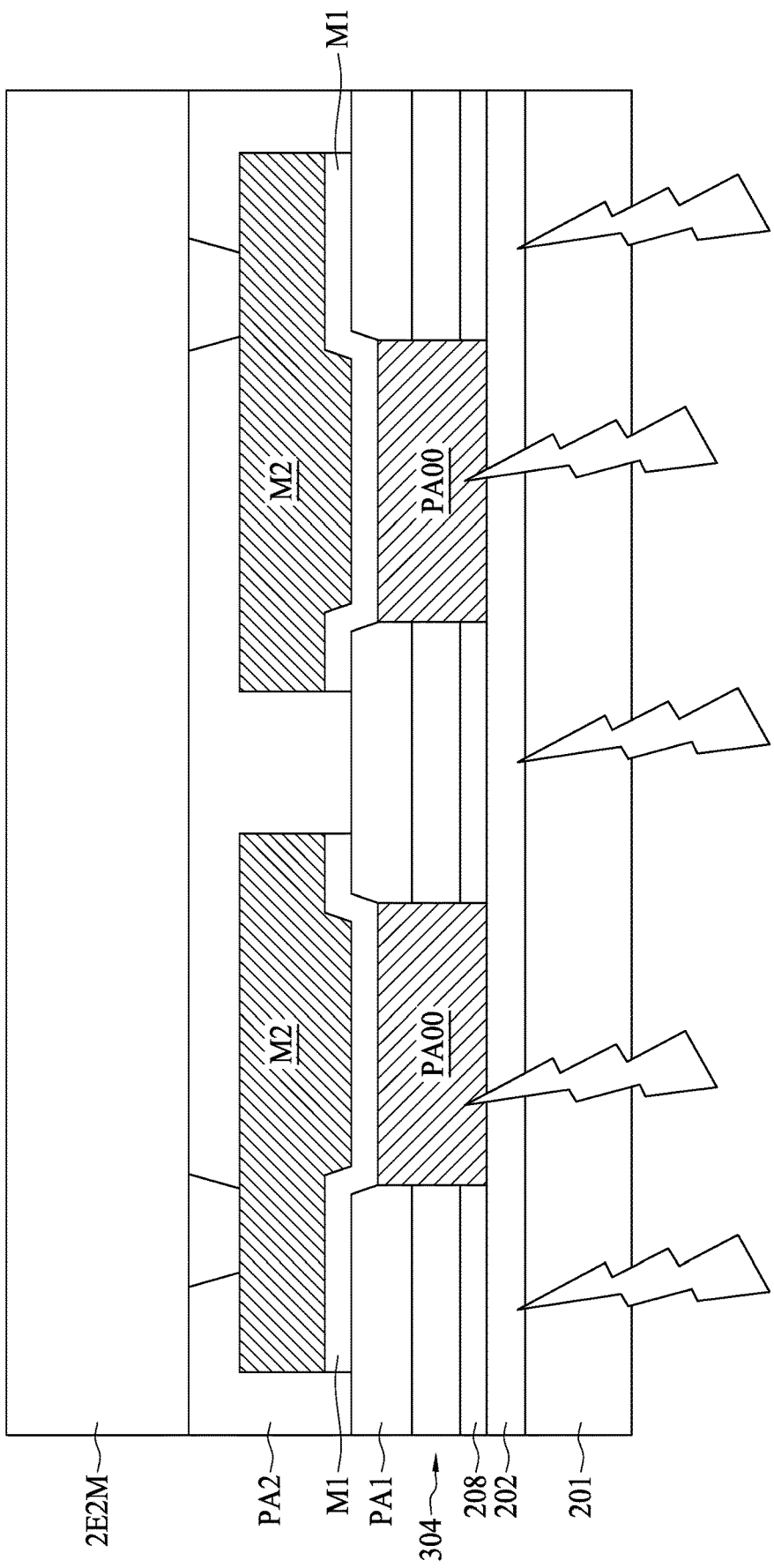
Figure 3H:
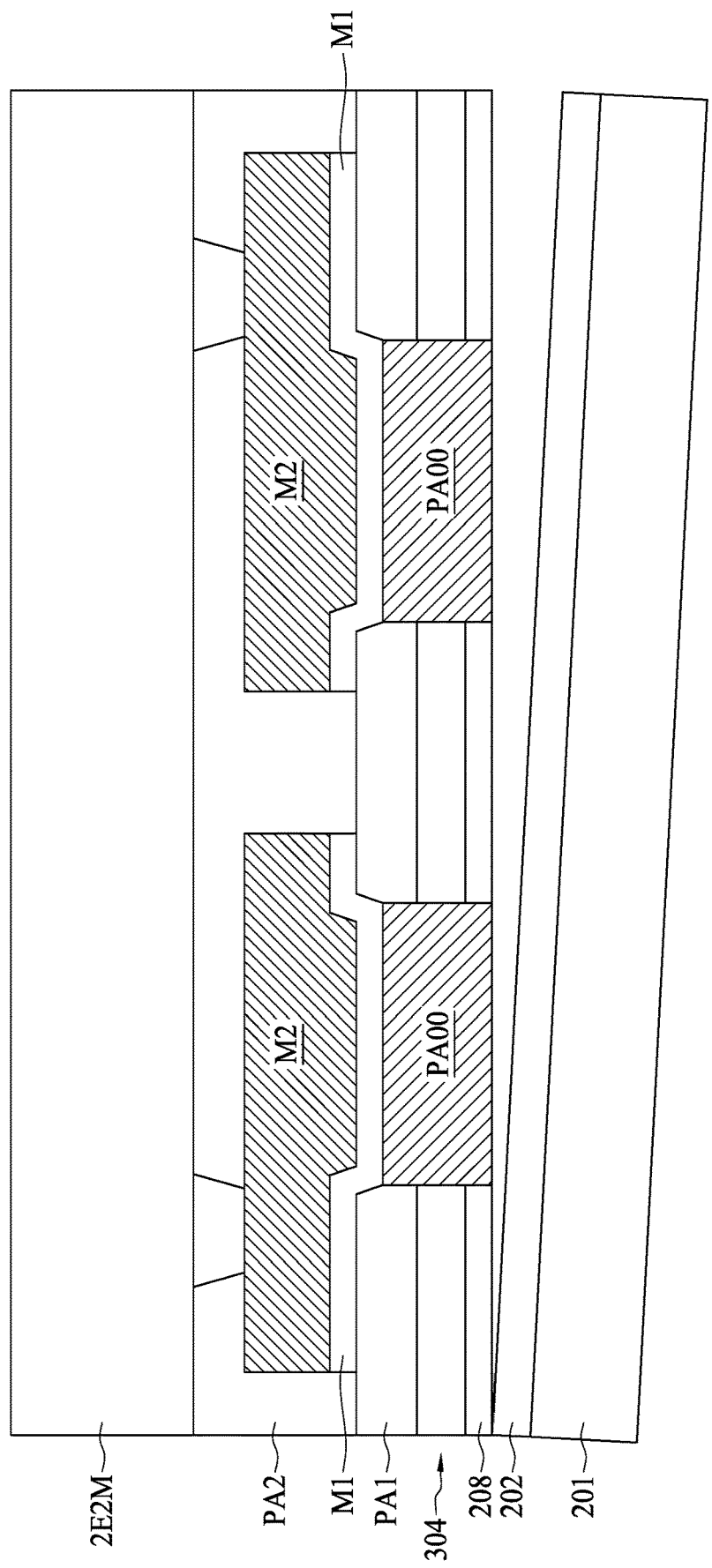

Next, referring to FIG. 3G, after the testing and the second carrier 301 with the second release film 302 is bonded, the first carrier 201 and the first release film 202 are removed by a de-bonding process, including, for example, a laser de-bonding process. Portions PA00 of the first dielectric layer PA1, which are unmasked by the patterned buffer layer 208, are exposed to the laser light via the transparent first carrier 201. The exposed portions PA00 subjected to laser radiation are gently de-bonded from the first carrier 201, as illustrated in FIG. 3H.

Figure 3I:
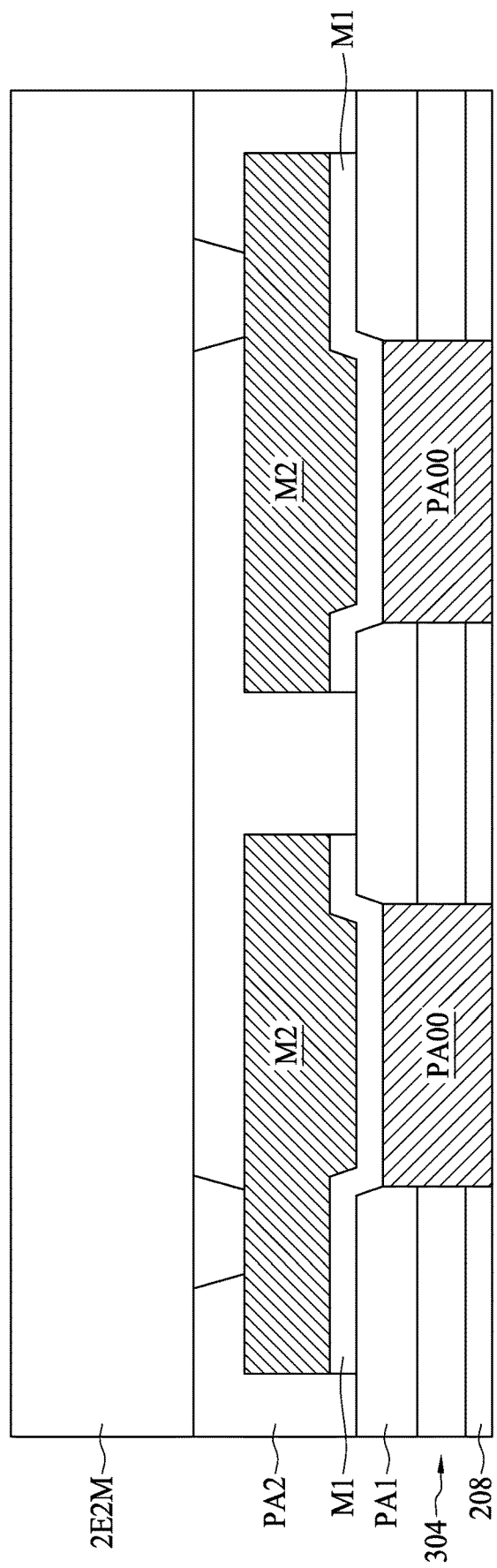
Figure 3J:
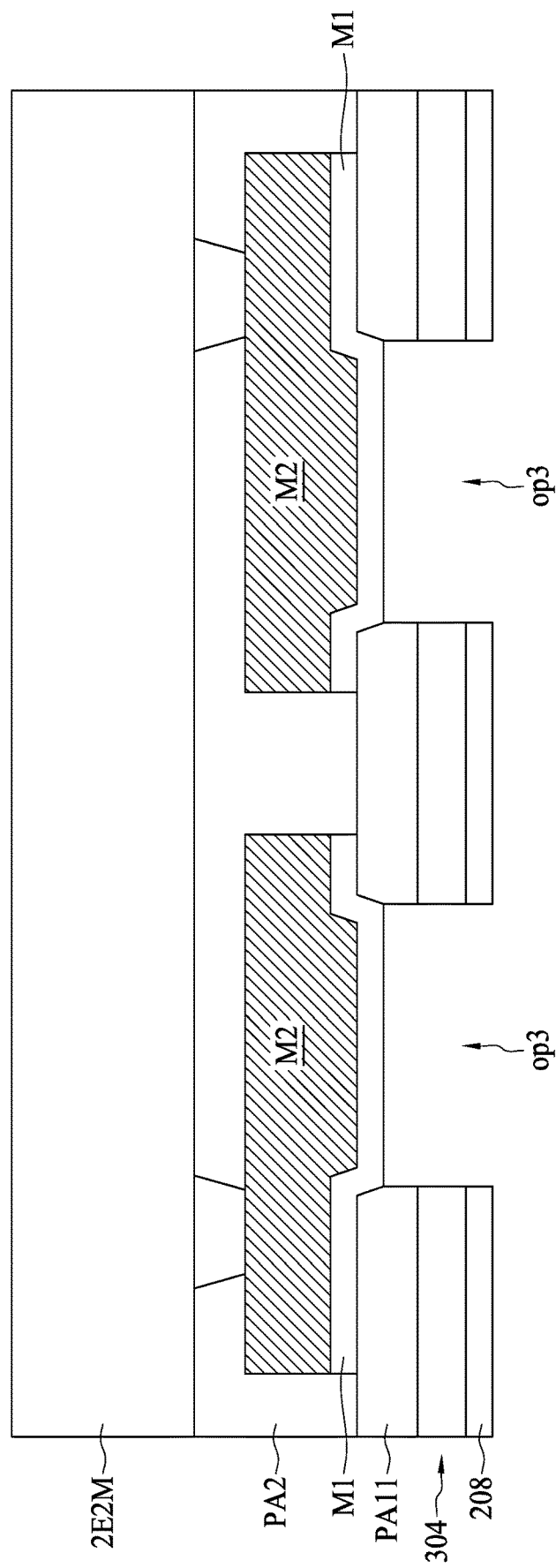

Referring to FIG. 3I, the first carrier 201 and the first release film 202 are removed, exposing the patterned buffer layer 208 and the de-bonded portions PA00 of the first dielectric layer PM. The de-bonded portions PA00 of the first dielectric layer PA1 are subsequently removed, resulting in a patterned first dielectric layer PA11 as illustrated in FIG. 3J. Referring to FIG. 3J, the patterned first dielectric layer PA11 exposes portions of the first conductive layer M1 through openings op3. The opening op3, where the de-bonded portion PA00 is located before removed, is defined by the patterned buffer layer 208, the patterned first dielectric layer PA11, the patterned passivation layer 304 and the first conductive layer M1.

Figure 3K:
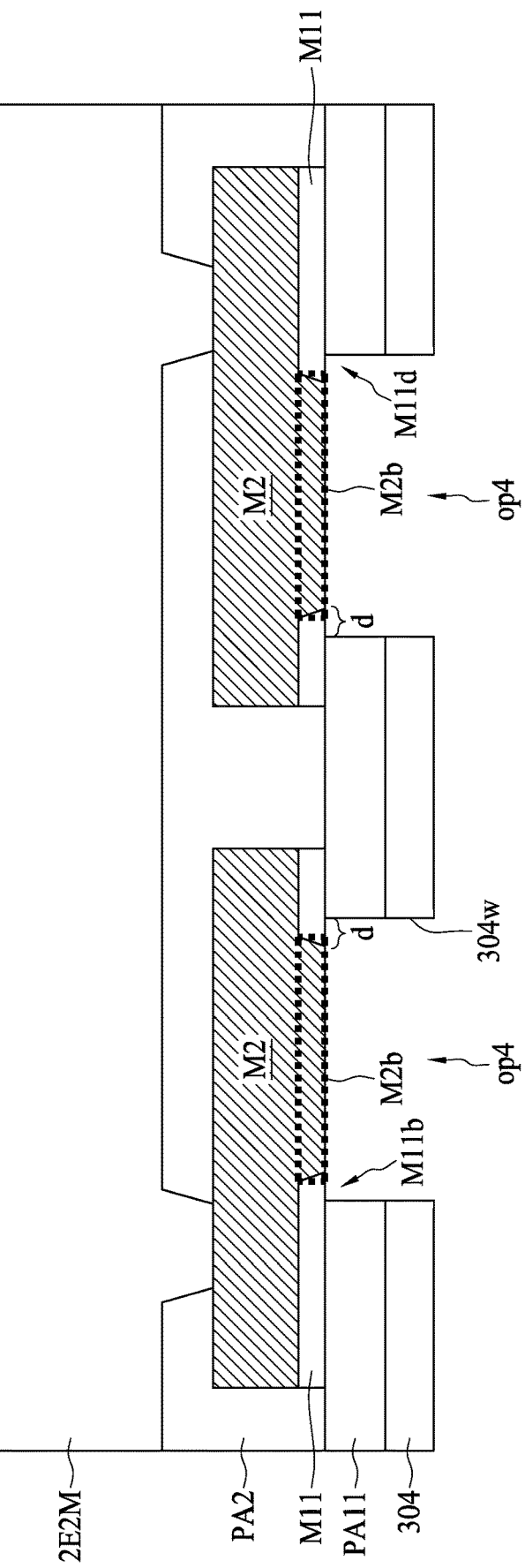

Referring to FIG. 3K, the patterned buffer layer 208 and the exposed portions of the first conductive layer M1 are removed, resulting in a patterned first conductive layer M11. The patterned first conductive layer M11 exposes the bulge portions M2b of the second conductive layer M2. In an embodiment, the patterned buffer layer 208 and the first conductive layer M1 include substantially the same material and thus may be removed at the same time by, for example, an etching process. Consequently, a recess op4, defined by the patterned first dielectric layer PA11 and the patterned passivation layer 304, for holding or accommodating an electrical conductor is formed. The patterned first conductive layer M11 includes portions M11d unmasked by the patterned first dielectric layer PA11 and each extending over a corresponding sidewall 304w of the patterned passivation layer 304 by a distance d. The portions M11d are contiguous with a bulge portion M2b of the second conductive layer M2 and form, together with the bulge portion M2b, a bottom surface of the recess op4 for seating an electrical conductor 146. Accordingly, the recess op4 is defined by the bulge portion M2b of the second conductive layer M2 as well as the patterned first dielectric layer PA11 and the patterned passivation layer 304. Specifically, the recess op4 is defined by the unmasked portions M11d of the patterned first conductive layer M11, the bulge portion M2b of the second conductive layer M2, the patterned first dielectric layer PA11 and the patterned passivation layer 304.

Subsequently, other semiconductor components, devices and structures, as those described and illustrated with reference to FIGS. 2R through 2U, are then formed or disposed on or over the patterned passivation layer 304 and the bulge portions M2b of the second conductive layer M2. Exemplary fabrication processes, materials and dimensions for these components, devices and structures can be found in the embodiments in FIGS. 2R through 2U and therefore are not further discussed. Consequently, a semiconductor package structure similar to or the same as the semiconductor package structure 20 as described and illustrated with reference to FIG. 1B is achieved.

Figure 4A:
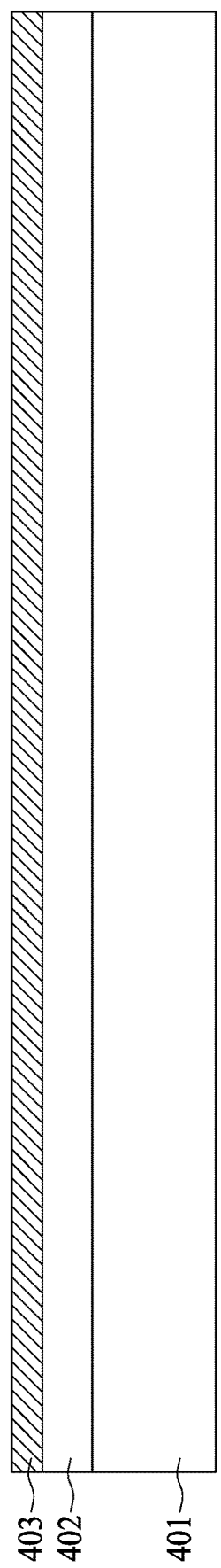
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, and FIG. 4P are cross-sectional views each illustrating one or more stages of a method of manufacturing a semiconductor package structure, in comparison with the method described and illustrated with reference to FIG. 2A through FIG. 2U.
Figure 4B:
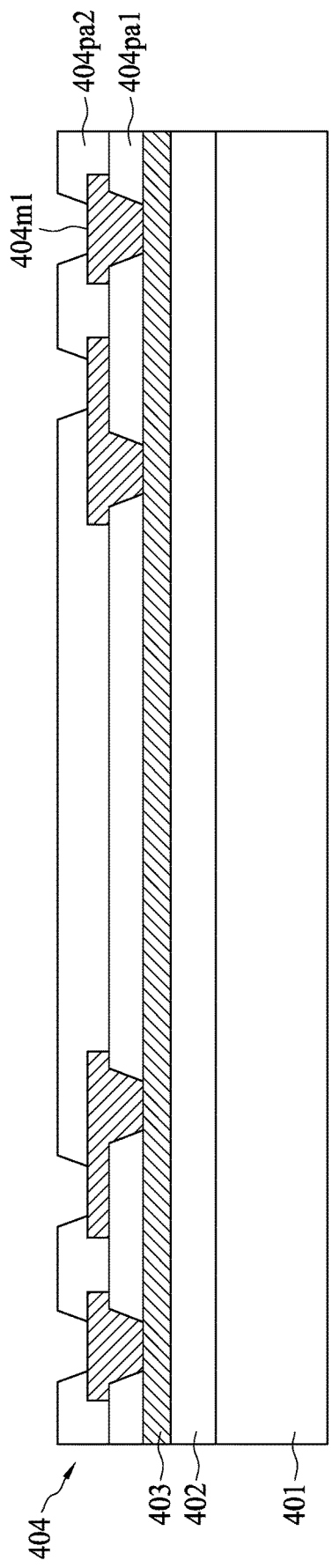
Figure 4C:
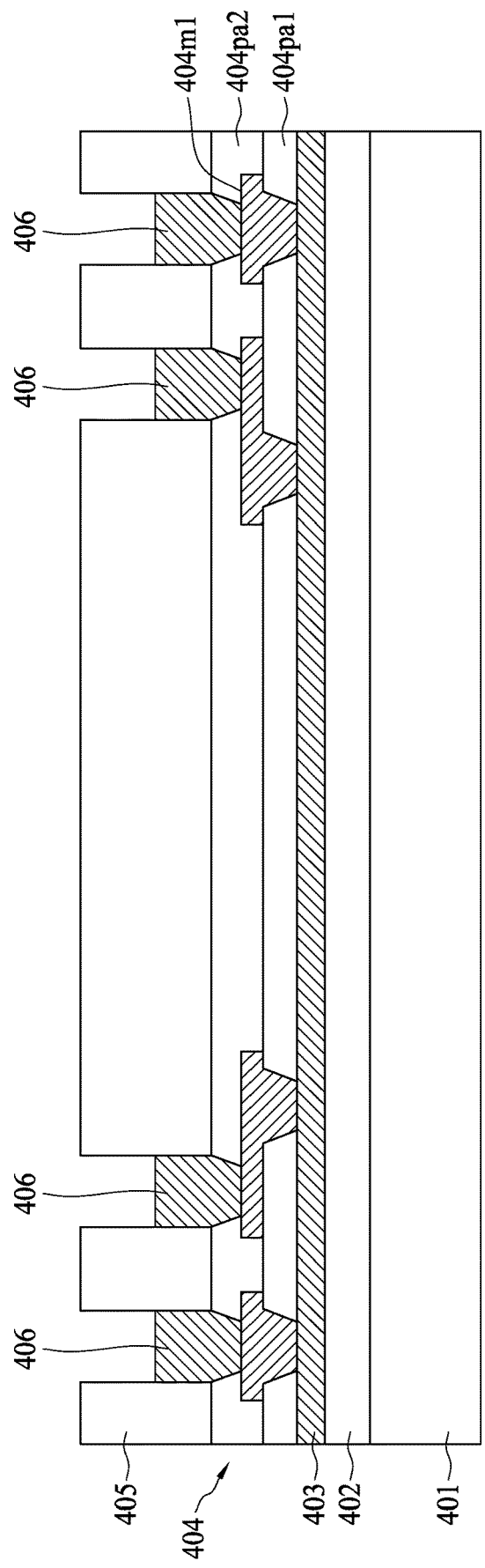
Figure 4D:
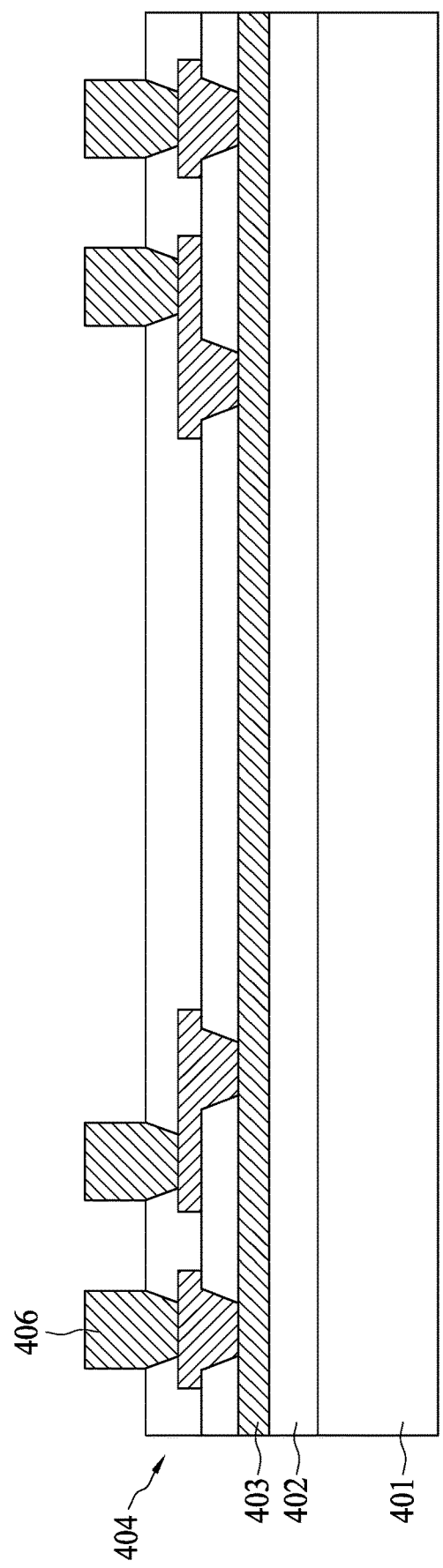
Figure 4E:
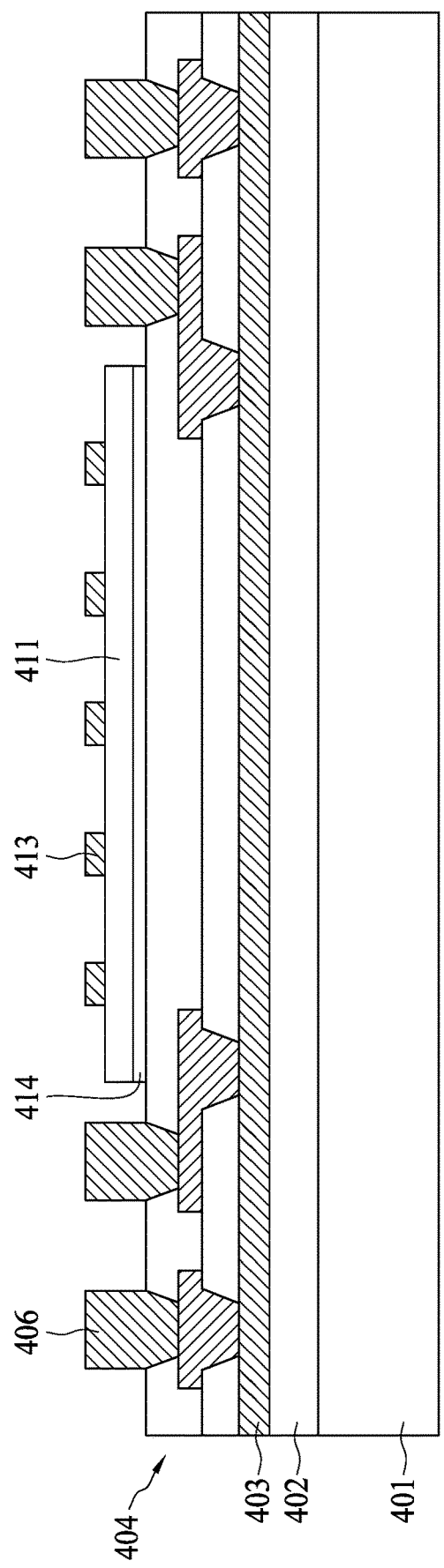
Figure 4F:
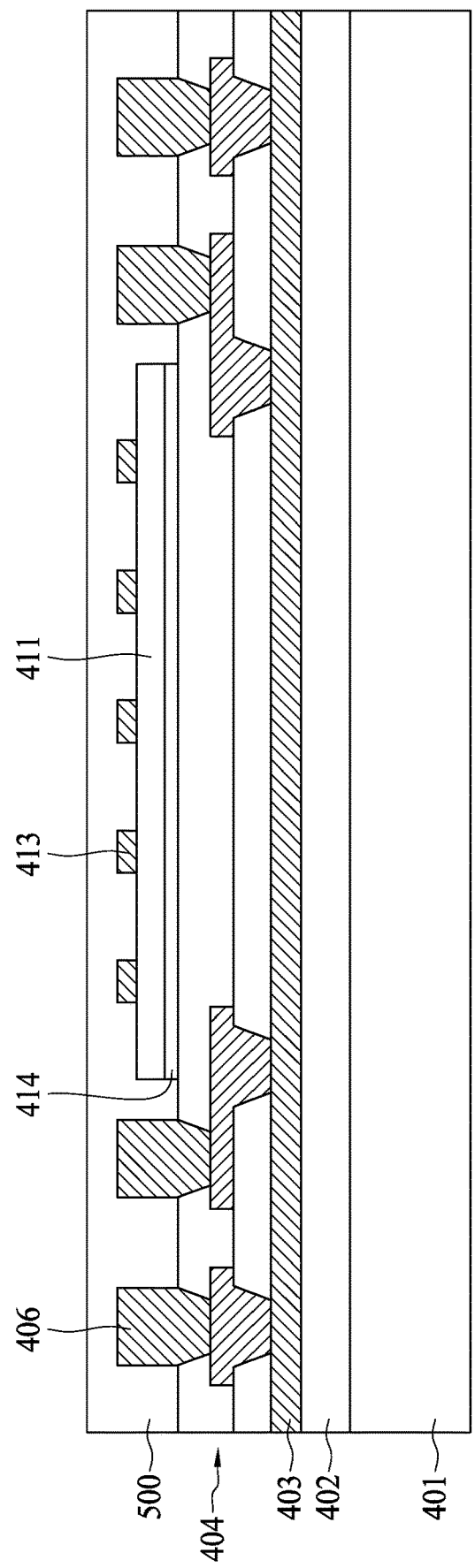
Figure 4G:
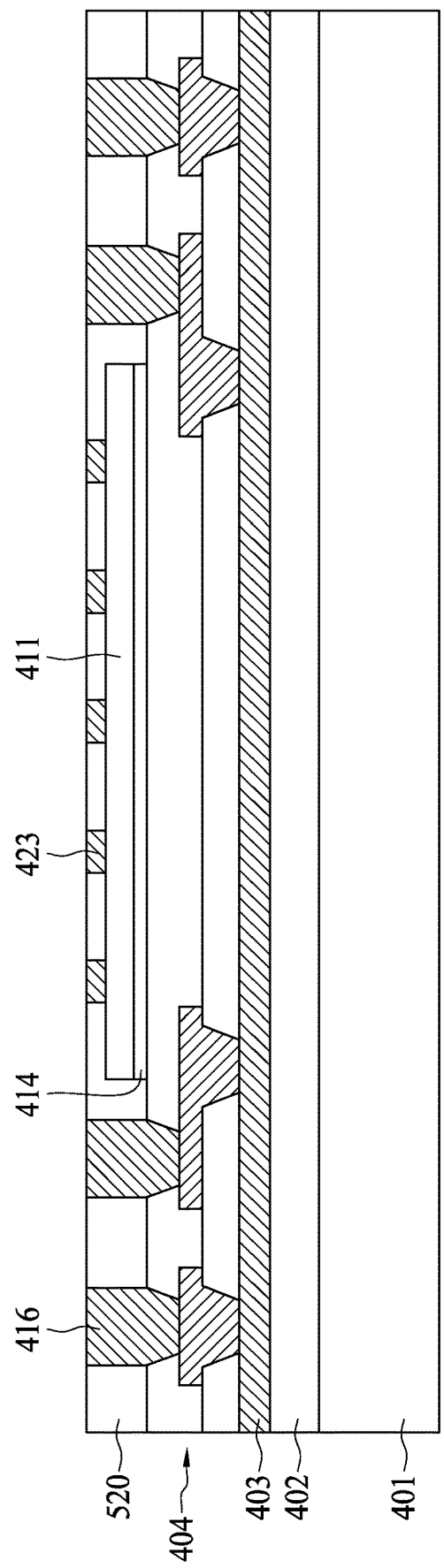
Figure 4H:
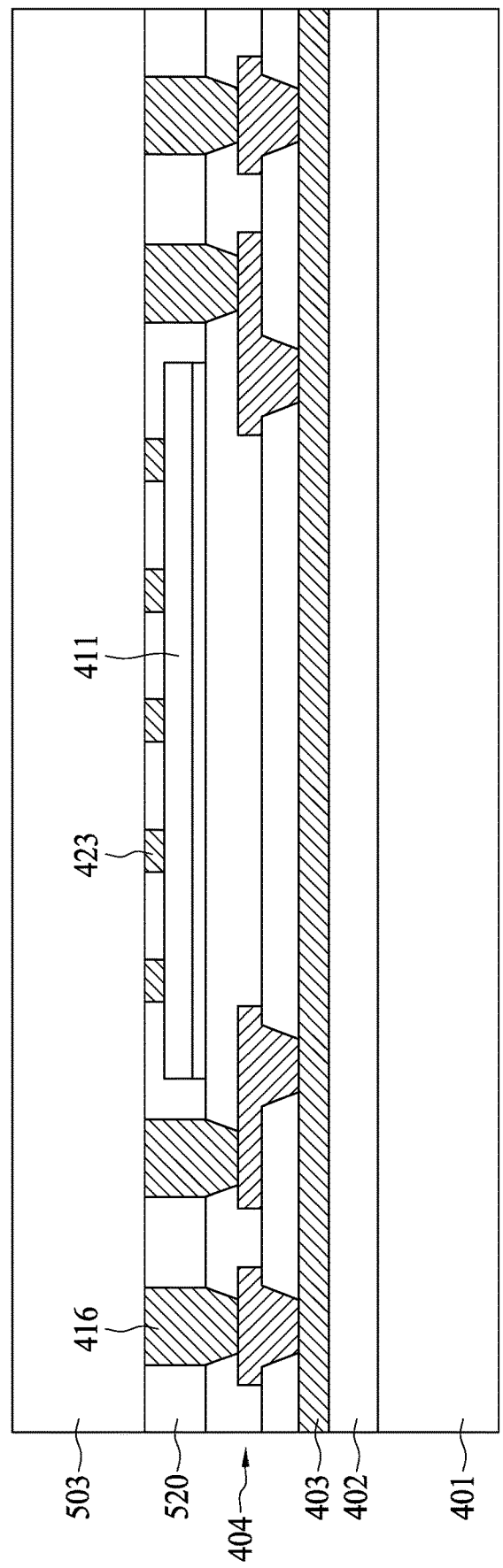
Figure 4I:
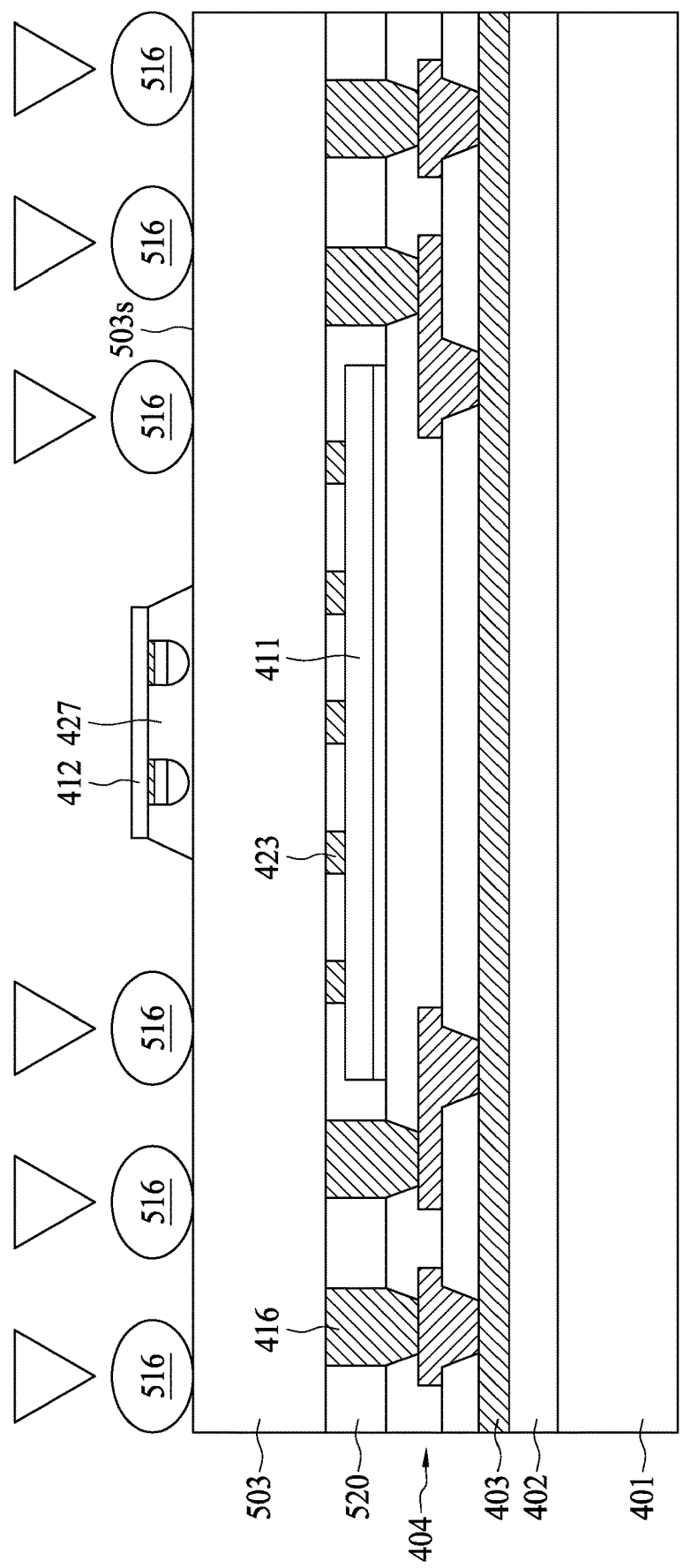
Figure 4J:
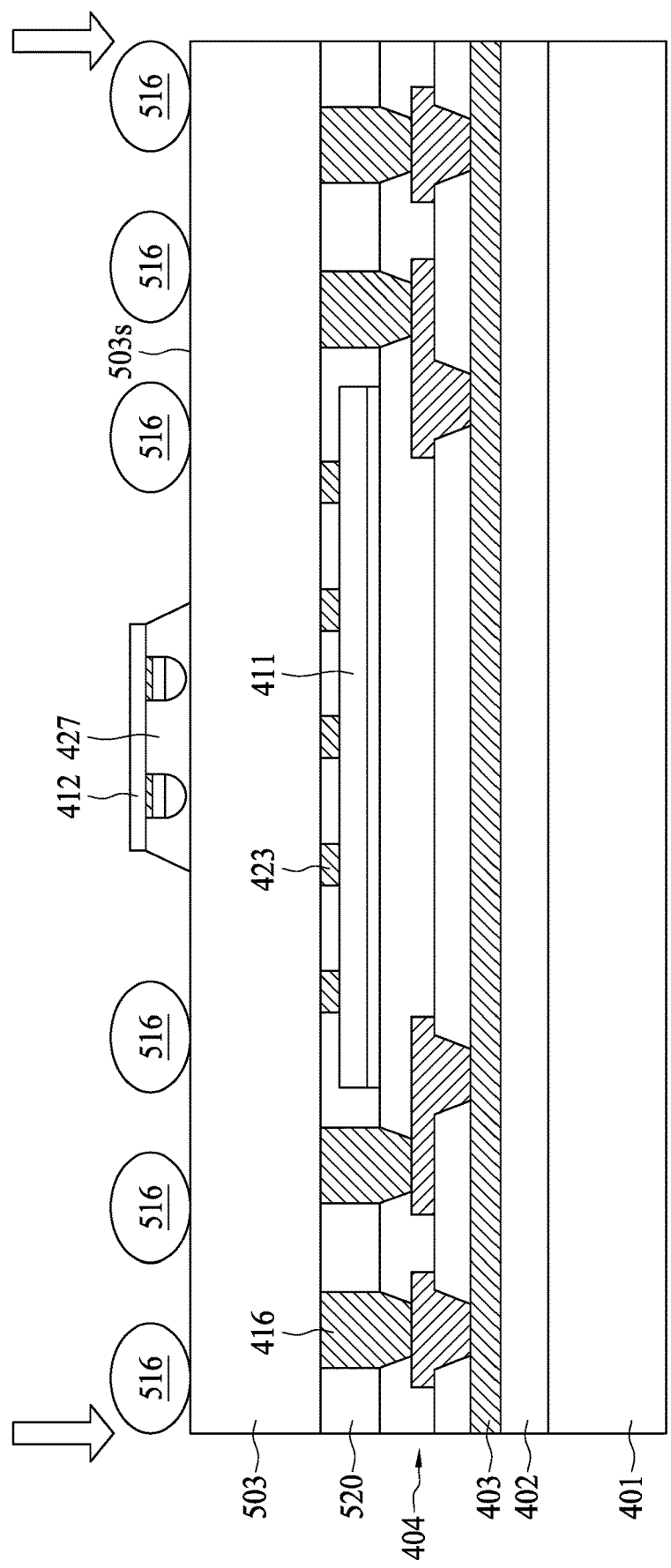
Figure 4K:
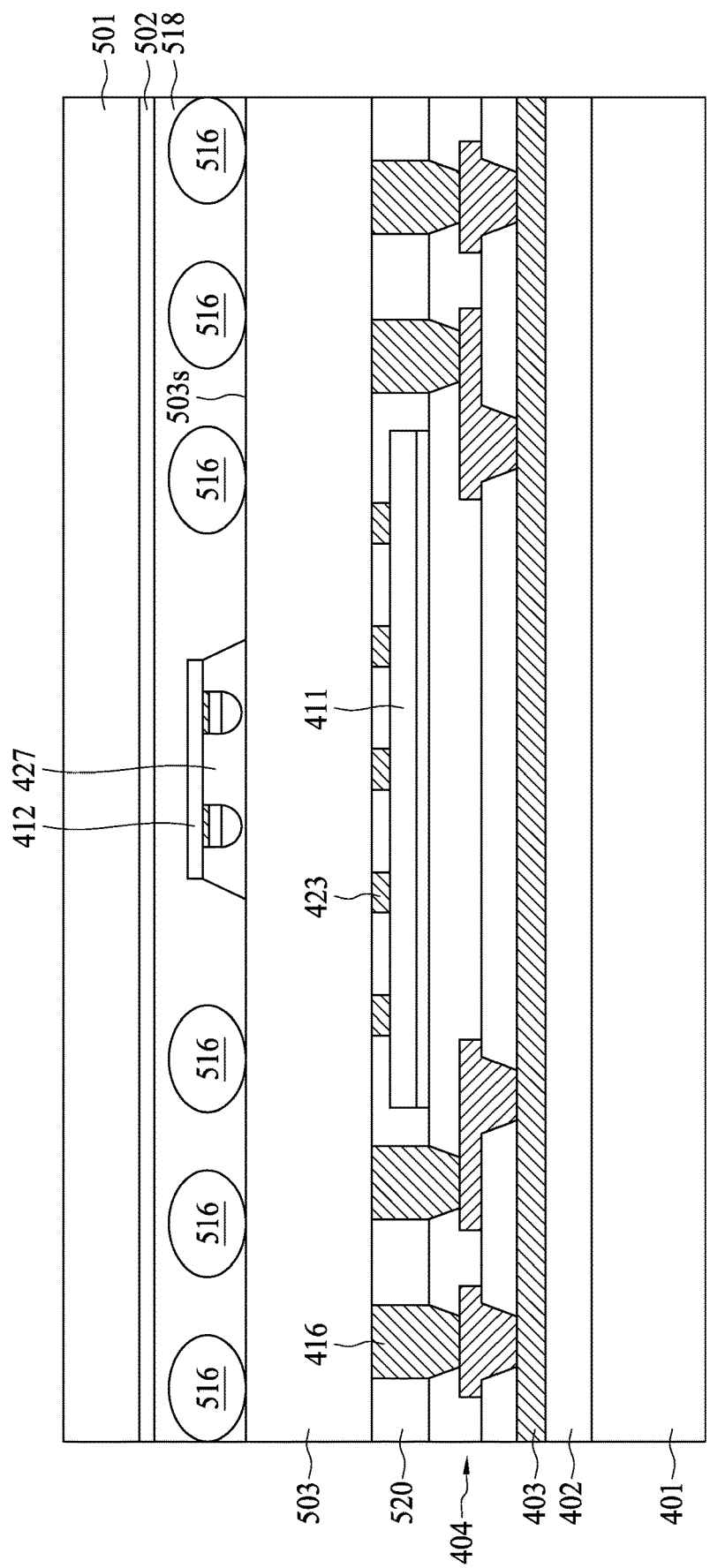
Figure 4L:
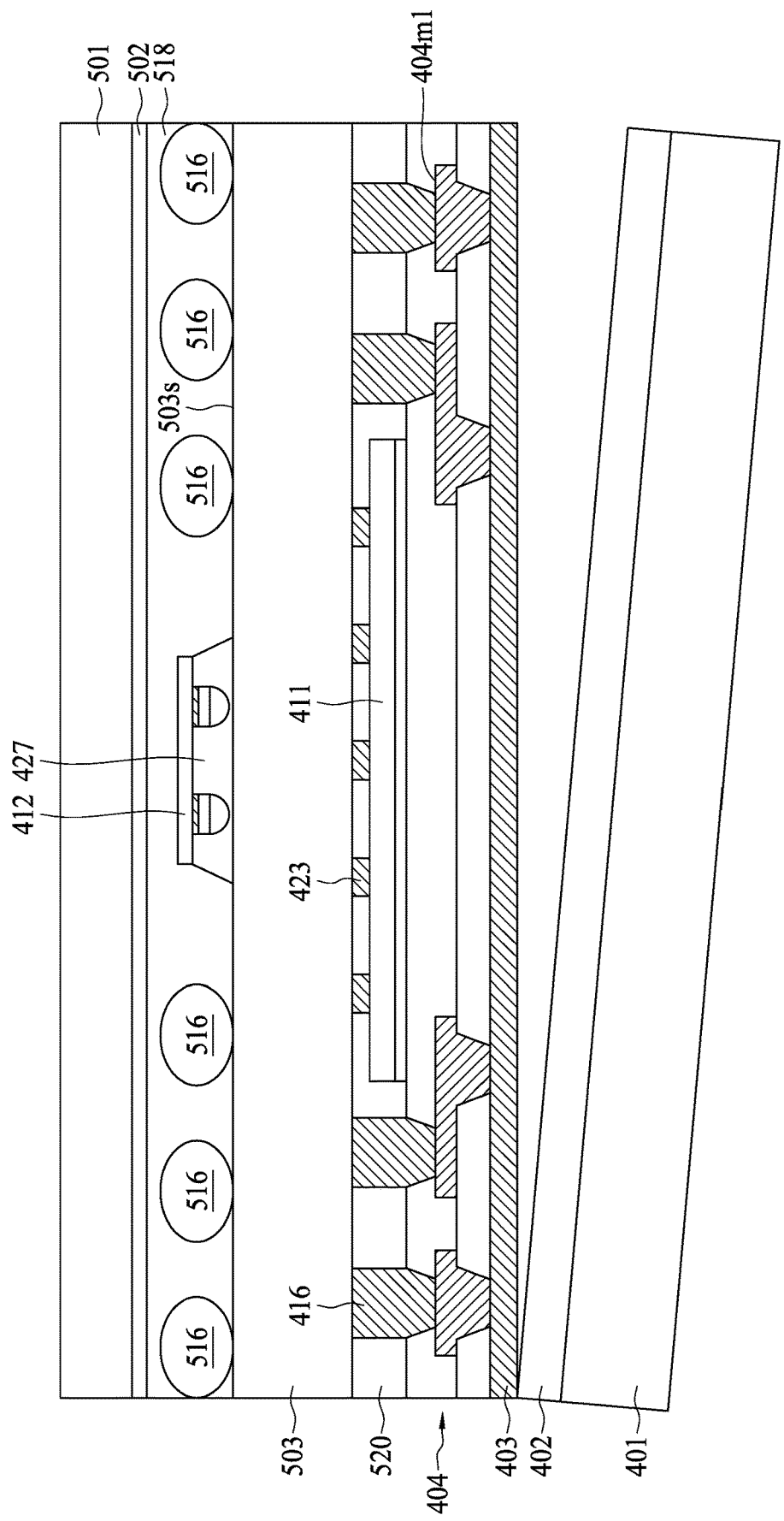
Figure 4M:
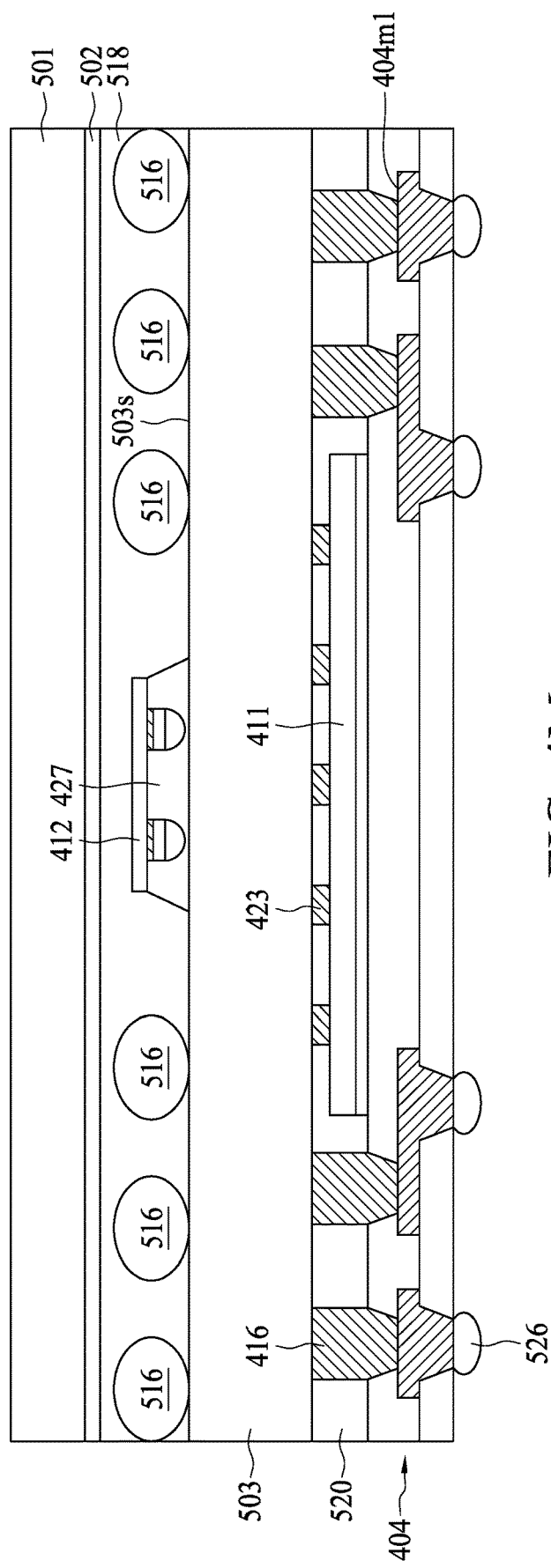
Figure 4N:
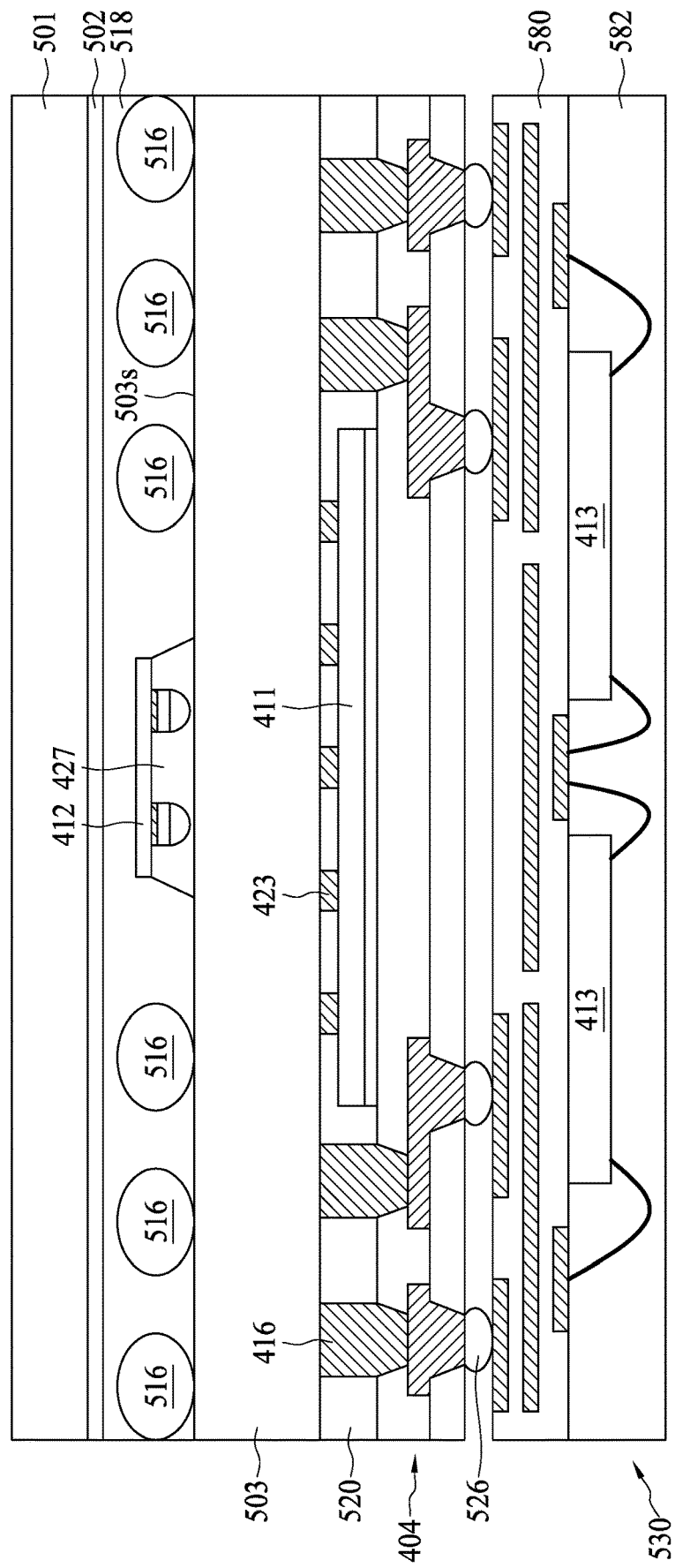
Figure 4O:
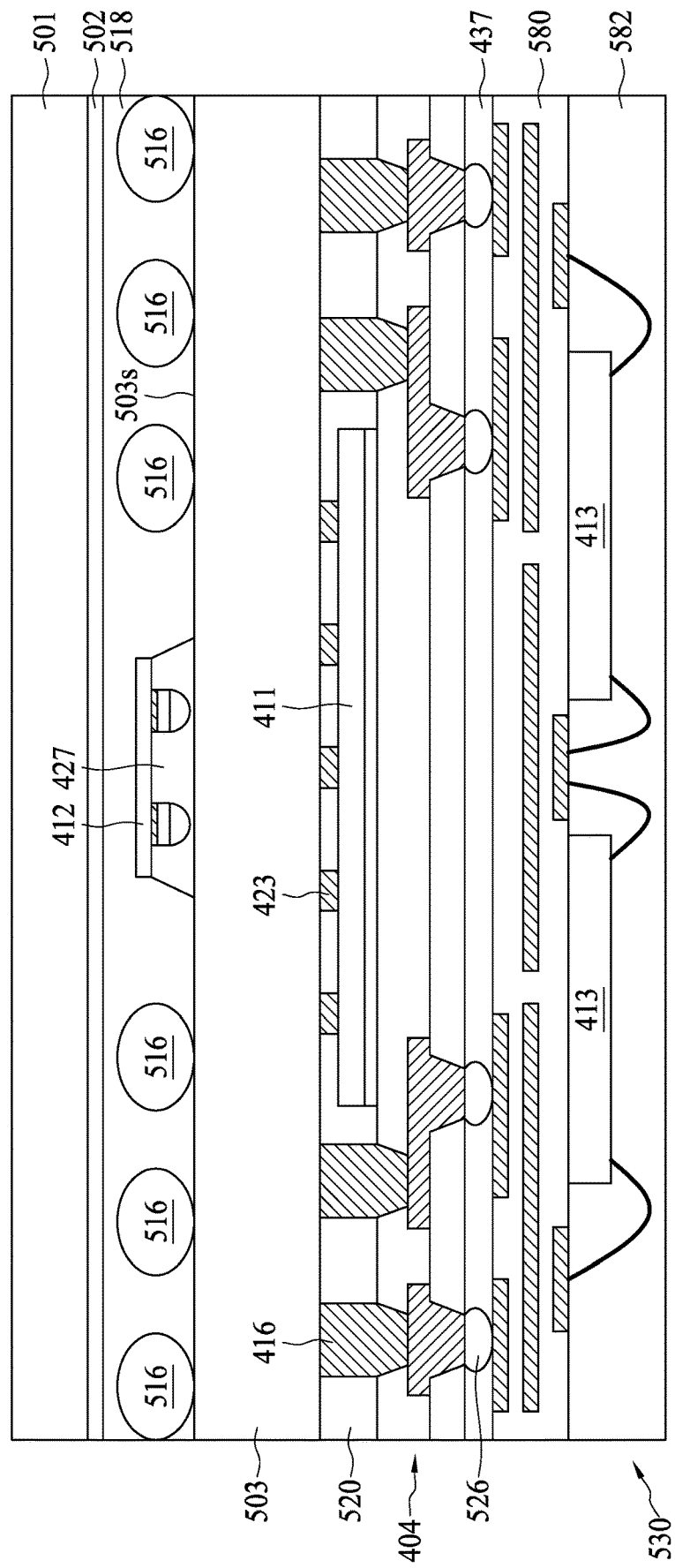
Figure 4P:
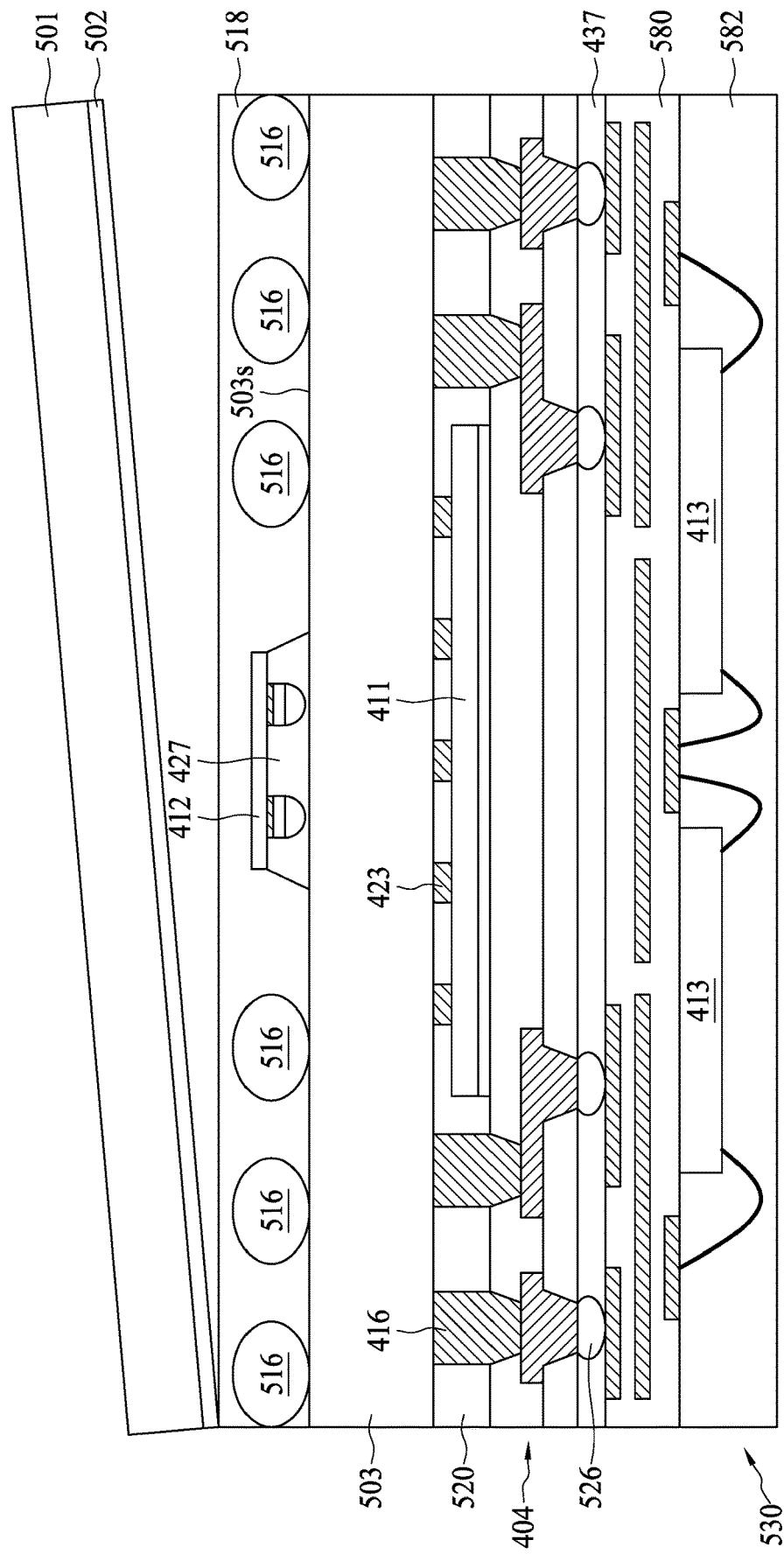

FIG. 4A through FIG. 4P are cross-sectional views each illustrating one or more stages of a method of manufacturing a semiconductor package structure, in comparison with the method described and illustrated with reference to FIG. 2A through FIG. 2U.

Referring to FIG. 4A, a first carrier 401 with a first release film 402 is provided. Next, a buffer layer 403 is formed on the first release film 402.

Referring to FIG. 4B, a first redistribution structure 404 is formed on the buffer layer 203. The first redistribution structure 404 includes a first dielectric layer 404pa1, a second dielectric layer 404pa2 and a conductive layer 404m1. In forming the first redistribution structure 404, the first dielectric layer 404pa1 is patterned, exposing portions of the buffer layer 403. Subsequently, the conductive layer 404*m*1 is formed on the first dielectric layer 404*pa*1 and thus is in electrical connection with the buffer layer 403 at the exposed portions.

Next, referring to FIG. 4C, a patterned photoresist layer 405 is formed on the second dielectric layer 404*pa*2, exposing portions of the conductive layer 404*m*1. Conductive pillars 406 are subsequently formed in the patterned photoresist layer 405 to electrically connect to the first redistribution structure 404 at the exposed portions of the conductive layer 404*m*1. The patterned photoresist layer 405 is then removed, as shown in FIG. 4D.

Referring to FIG. 4E, a first semiconductor device 411 is attached onto the second dielectric layer 404*pa*2 by means of an adhesive layer 414. The first semiconductor device 411 includes conductive studs 413.

Afterwards, referring to FIG. 4F, an encapsulating layer 500 is formed on the first redistribution structure 404, covering the second dielectric layer 404*pa*2, conductive pillars 406 and conductive studs 413. The encapsulating layer 500 is subsequently reduced in height in a polishing process, resulting in a reduced encapsulating layer 520, as shown in FIG. 4G. The reduced encapsulating layer 520 exposes conductive pillars 416 and conductive studs 423, which during the polishing process may also be reduced in height from the conductive pillars 406 and conductive studs 413, respectively.

Next, referring to FIG. 4H, a second redistribution structure 503 is formed on the reduced encapsulating layer 520. The second redistribution structure 503 includes conductive layers (not shown) in electrical connection with the conductive studs 423 of the first semiconductor device 411 and the conductive pillars 416, which in turn in electrical connection with the first redistribution structure 404 and the buffer layer 403.

Referring to FIG. 4I, electrical conductors 516 are mounted on the second redistribution structure 503. In addition, a second semiconductor device 412 is mounted on the second redistribution structure 503. An underfill 427 is applied between the second semiconductor device 412 and the second redistribution structure 503. Subsequently, a wafer level function test (represented by triangles) would be performed to determine if electric performance of semiconductor structures in a wafer manufactured so far on the carrier 401 is desirable. However, since the buffer layer 403 is not patterned, during the test the unpatterned buffer layer 403 that spreads over the first carrier 401 may be electrically connected with all or at least a significant part of the electrical conductors 516 via the first redistribution structure 404, the conductive pillars 416 and the second redistribution structure 503. As a result, a test signal applied from an electrical conductor 516 during the test is liable to error due to signal interference. In contrast, in the embodiments according to the present disclosure, the buffer layer 203 (FIG. 2B, FIG. 3A) is patterned, resulting in a patterned buffer layer 208 (FIG. 2C, FIG. 3B), which facilitates defining locations of electrical conductors to be subsequently formed for external connection. Moreover, the first dielectric layer PA1 is kept unpatterned before the testing. The unpatterned first dielectric layer PA1 electrically isolates the patterned buffer layer 208 to facilitate the testing.

Then in FIG. 4J, edges of the wafer are trimmed (indicated by arrows showing movement) to remove excessive encapsulating material to facilitate a subsequent bonding process. Referring to FIG. 4K, an adhesive layer 518 is formed on a surface 503*s* of the second redistribution structure 503, covering the second semiconductor device 412 and the electrical conductors 516. Next, a second carrier 501 with a second release film 502 is bonded onto the adhesive layer 518.

Referring to FIG. 4L, after the second carrier 501 together with the second release film 502 is bonded, the first carrier 401 and the first release film 402 are removed by a de-bonding process, exposing the buffer layer 403. Afterwards, the buffer layer 403 is removed in an etching process, exposing the conductive layer 404*m*1 of the first redistribution structure 404. Next, referring to FIG. 4M, electrical conductors 526 are mounted on the conductive layer 404*m*1 to provide electric connection for the first redistribution structure 404.

Referring to FIG. 4N, a packaged device 530 is provided. The packaged device 530 includes one or more third semiconductor devices 413 and a redistribution structure 580. The third semiconductor devices 413 are sealed in an encapsulating layer 582. The redistribution structure 580, disposed between the encapsulating layer 582 and the electrical conductors 526, provides electric connection for the semiconductor devices 413. Referring to FIG. 4O, an underfill 437 is then applied between the first redistribution structure 404 and the packaged device 530.

Subsequently, referring to FIG. 4P, the second carrier 501 together with the second release film 502 is removed by a de-bonding process. The adhesive layer 518 is then also removed, exposing the electrical conductors 516 and the second semiconductor device 412. Next, a singulation process is performed to saw the wafer into individual device units.

FIG. 5A through FIG. 5E are cross-sectional views each illustrating one or more stages of another method of manufacturing a semiconductor package structure, in comparison with the method described and illustrated with reference to FIG. 2A through FIG. 2U. Since a testing at FIG. 4I with the buffer layer 403 being present is likely to fail, the testing may be conducted at a later time when the buffer layer 403 is removed.

Figure 5A:
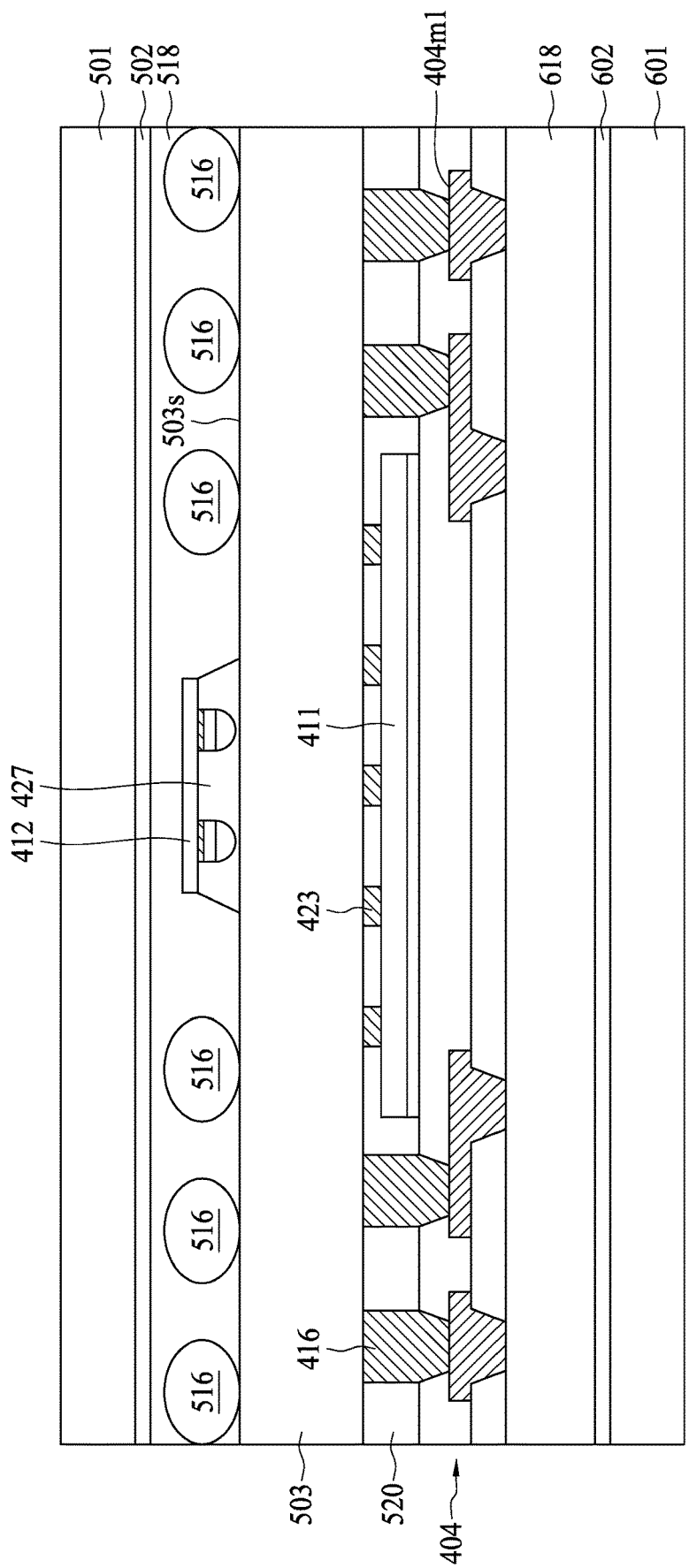
FIG. 5A, FIG. 5B, FIG. 5C, FIG. 5D, and FIG. 5E are cross-sectional views each illustrating one or more stages of another method of manufacturing a semiconductor package structure, in comparison with the method described and illustrated with reference to FIG. 2A through FIG. 2U.
Figure 5B:
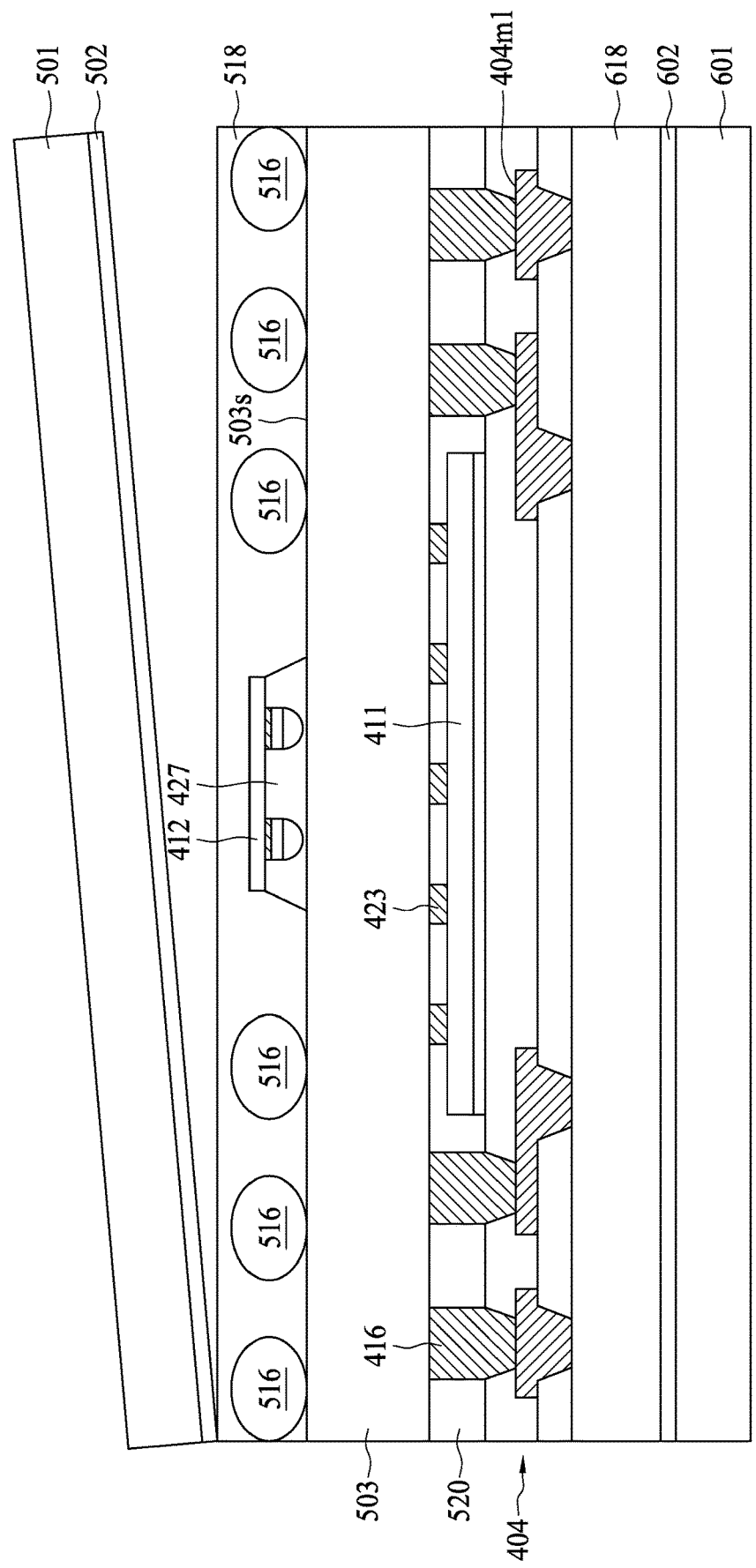
Figure 5C:
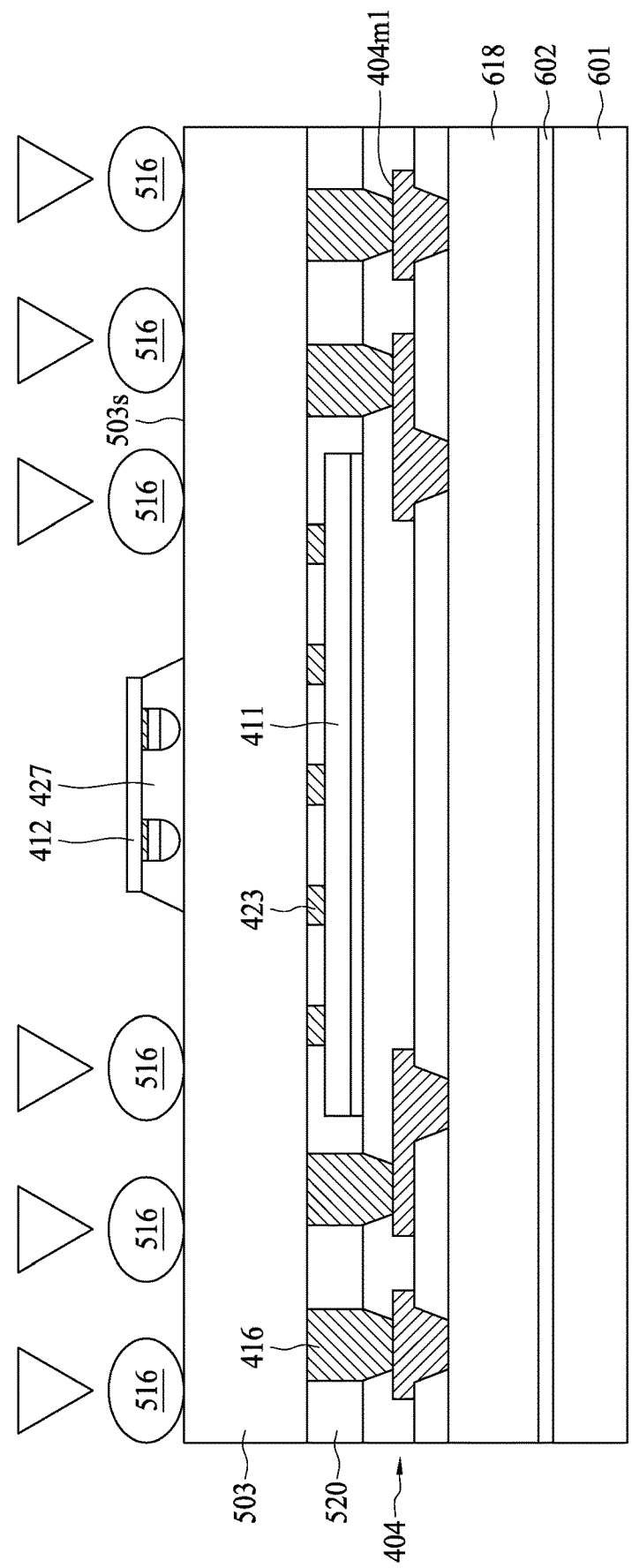

Referring back to FIG. 4L, after the first carrier 401, the first release film 402 and subsequently the buffer layer 403 are removed, now referring to FIG. 5A, a third carrier 601 together with a third release film 602 is attached to the first redistribution structure 404 with the help of an adhesive layer 618. Afterwards, the second carrier 501, the second release film 502 and their associated adhesive layer 518 are removed, as shown in FIG. 5B, exposing the electrical conductors 516. Since the buffer layer 403 is removed and the electrical conductors 516 are exposed, a testing is conducted, as shown in FIG. 5C.

Figure 5D:
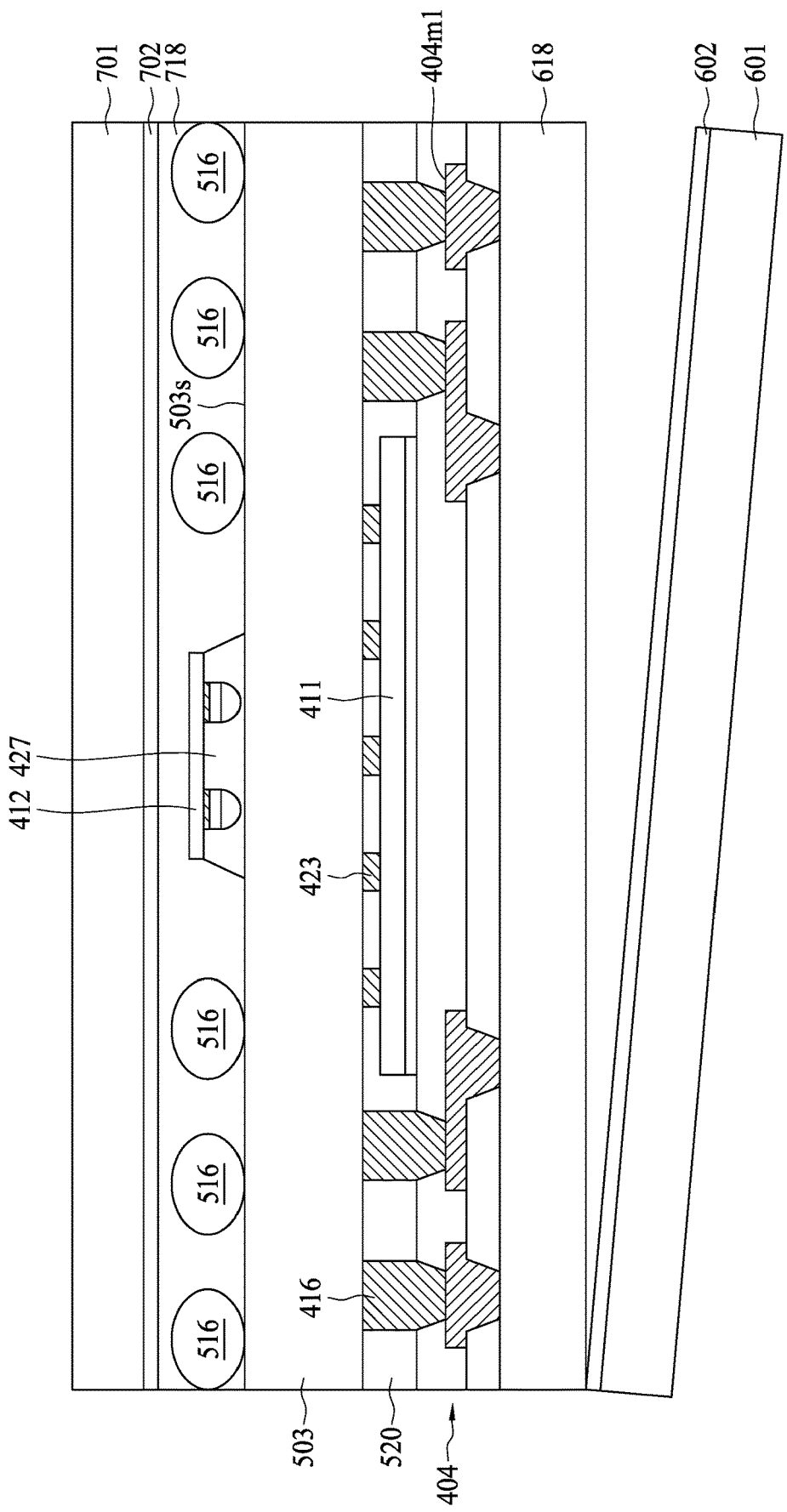
Figure 5E:
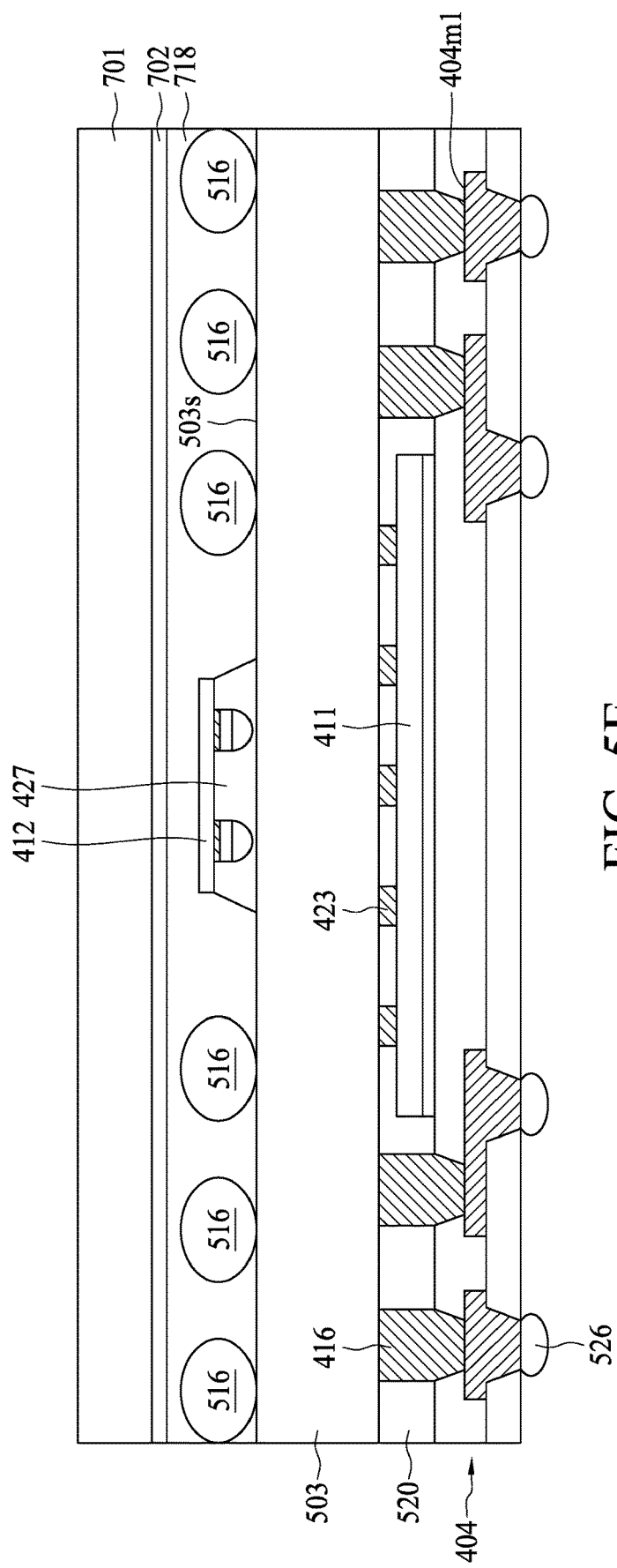

After the testing, referring to FIG. 5D, a fourth carrier 701 together with a fourth release film 702 is attached over the surface 503*s* of the second redistribution structure 503 with the help of an adhesive layer 718. Next, the third carrier 601, the third release film 602 and their associated adhesive layer 618 are removed, exposing the conductive layer 404*m*1 of the first redistribution structure 404. Then, referring to FIG. 5E, electrical conductors 526 are mounted on the conductive layer 404*m*1 to provide electric connection for the first redistribution structure 404. The subsequent processes are similar to or identical with those described and illustrated with reference to FIGS. 4N, 4O and 4P and thus are not discussed.

To postpone the testing, as compared to the methods in the embodiments according to the present disclosure, additional third and fourth carriers 601, 701, additional third and fourth release films 602, 702, additional adhesive layers 618, 718 are included. Moreover, additional bonding and debonding processes are also performed. As a result, the method described and illustrated with reference to FIGS. 5A to 5E is not cost efficient in view of the methods described and illustrated in FIGS. 2A to 2U or FIGS. 3A to 3K according to the present disclosure.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a first semiconductor device;
    a second semiconductor device;
    a redistribution structure for electrical connection between the first semiconductor device and the second semiconductor device, the redistribution structure including:
        a patterned first dielectric layer having a first surface and a second surface opposite to the first surface;
        a second dielectric layer, between the first semiconductor device and the patterned first dielectric layer, disposed on the first surface of the patterned first dielectric layer;
        a patterned first circuit layer disposed on the first surface of the patterned first dielectric layer and extending in the second dielectric layer; and
        a second circuit layer stacked on the patterned first circuit layer and extending in the second dielectric layer; and
    an electric conductor, disposed in a recess defined by the patterned first dielectric layer and the patterned first circuit layer, for electric connection via the redistribution structure.

2. The semiconductor package structure of claim 1, wherein the electric conductor penetrates the patterned first dielectric layer.

3. The semiconductor package structure of claim 1, wherein the electric connector connects the second circuit layer to the second semiconductor device.

4. The semiconductor package structure of claim 3, wherein the recess is further defined by the second circuit layer in addition to the patterned first dielectric layer and the patterned first circuit layer.

5. The semiconductor package structure of claim 4, wherein the electrical conductor includes a first portion accommodated in the recess, and a second portion protruding from the second surface of the patterned first dielectric layer.

6. The semiconductor package structure of claim 5 further comprising an underfill layer on the second surface of the patterned first dielectric layer, the underfill layer sealing the second portion of the electrical conductor.

7. A semiconductor package structure, comprising:
    a first semiconductor device;
    a second semiconductor device;
    a patterned passivation layer between the first semiconductor device and the second semiconductor device;
    a redistribution structure for electrical connection between the first semiconductor device and the second semiconductor device, the redistribution structure including:
        a patterned first dielectric layer, disposed on the patterned passivation layer, having a first surface and a second surface opposite to the first surface;
        a second dielectric layer, between the first semiconductor device and the patterned first dielectric layer, disposed on the first surface of the patterned first dielectric layer;
        a patterned first circuit layer disposed on the first surface of the patterned first dielectric layer and extending in the second dielectric layer;
        a second circuit layer, disposed on the patterned first circuit layer, including a bulge portion extending into the patterned first circuit layer; and
    an electric conductor, disposed in a recess defined by the patterned passivation layer, the patterned first dielectric layer and the bulge portion of the second circuit layer, for electric connection via the redistribution structure.

8. The semiconductor package structure of claim 7, wherein the patterned first circuit layer includes portions unmasked by the patterned first dielectric layer.

9. The semiconductor package structure of claim 8, wherein the unmasked portions of the patterned first circuit layer are contiguous with the bulge portion of the second conductive layer.

10. The semiconductor package structure of claim 8, wherein the unmasked portions of the patterned first circuit layer and the bulge portion of the second conductive layer form a bottom surface of the recess for seating the electrical conductor.

11. The semiconductor package structure of claim 10, the recess is further defined by the unmasked portions of the patterned first circuit layer in addition to the bulge portion of the second conductive layer, the patterned passivation layer and the patterned first dielectric layer.

12. The semiconductor package structure of claim 7, wherein the electrical conductor includes a first portion accommodated in the recess, and a second portion protruding from the second surface of the patterned first dielectric layer.

13. The semiconductor package structure of claim 12 further comprising an underfill layer on the second surface of the patterned first dielectric layer, the underfill layer sealing the second portion of the electrical conductor.

14. The semiconductor package structure of claim 1, wherein the patterned first circuit layer includes a patterned first conductive layer disposed on the first surface of the patterned first dielectric layer and a second conductive layer stacked on the patterned first conductive layer, and the electrical conductor electrically connects the second conductive layer.

15. The semiconductor package structure of claim 1, wherein the patterned first circuit layer includes a patterned first conductive layer disposed on the first surface of the patterned first dielectric layer and a second conductive layer stacked on the patterned first conductive layer, and the electrical conductor penetrates the patterned first conductive layer.

16. The semiconductor package structure of claim 1, wherein a portion of the electrical conductor protrudes from the first surface of the patterned first dielectric layer.

17. The semiconductor package structure of claim 7, wherein the electrical conductor electrically connects the bulge portion of the second circuit layer.

18. The semiconductor package structure of claim 7, wherein the patterned first circuit layer includes a patterned first conductive layer disposed on the first surface of the patterned first dielectric layer and a second conductive layer stacked on the patterned first conductive layer, and the bulge portion of the second circuit layer penetrates the patterned first conductive layer.

19. The semiconductor package structure of claim 7, wherein the patterned first circuit layer includes a patterned first conductive layer disposed on the first surface of the patterned first dielectric layer and a second conductive layer stacked on the patterned first conductive layer, and the electrical conductor electrically connects the second conductive layer through the bulge portion of the second circuit layer.

* * * * *